(12) United States Patent
Wei et al.

(10) Patent No.: US 12,069,919 B2
(45) Date of Patent: Aug. 20, 2024

(54) DISPLAY PANEL AND DISPLAY DEVICE

(71) Applicants: Wuhan Tianma Micro-Electronics Co., Ltd., Wuhan (CN); Wuhan Tianma Micro-Electronics Co., Ltd. Shanghai Branch, Shanghai (CN)

(72) Inventors: Qibing Wei, Wuhan (CN); Peng Zhang, Wuhan (CN); Xingyao Zhou, Wuhan (CN); Gaojun Huang, Wuhan (CN); Lilian Kuang, Wuhan (CN)

(73) Assignees: Wuhan Tianma Micro-Electronics Co., Ltd., Wuhan (CN); Wuhan Tianma Micro-Electronics Co., Ltd. Shanghai Branch, Shanghai (CN)

( * ) Notice: Subject to any disclaimer, the term of this patent is extended or adjusted under 35 U.S.C. 154(b) by 0 days.

(21) Appl. No.: 18/243,084

(22) Filed: Sep. 6, 2023

(65) Prior Publication Data

US 2024/0081110 A1 Mar. 7, 2024

(30) Foreign Application Priority Data

Sep. 6, 2022 (CN) .......................... 202211086396.7

(51) Int. Cl.
*H10K 59/131* (2023.01)
*G09G 3/3225* (2016.01)

(52) U.S. Cl.
CPC ......... *H10K 59/131* (2023.02); *G09G 3/3225* (2013.01); *G09G 2300/0842* (2013.01); *G09G 2300/0861* (2013.01)

(58) Field of Classification Search
CPC .............. H10K 59/131; G09G 3/3225; G09G 2300/0842; G09G 2300/0861; G09F 9/30
See application file for complete search history.

(56) References Cited

U.S. PATENT DOCUMENTS

| 11,804,161 B1 * | 10/2023 | Gao | ..................... G09G 3/2074 |
| 2023/0046181 A1 * | 2/2023 | Choi | ..................... G06F 1/1686 |

(Continued)

FOREIGN PATENT DOCUMENTS

| CN | 110780501 A | 2/2020 |
| CN | 111710239 A | 9/2020 |
| CN | 113096588 A | 7/2021 |

(Continued)

*Primary Examiner* — Abhishek Sarma
(74) *Attorney, Agent, or Firm* — Anova Law Group, PLLC

(57) ABSTRACT

A display panel and a display device are provided. The display panel includes a display area and at least two non-display areas arranged adjacently along a first direction. The display area at least partially surrounds the non-display areas. Each non-display area includes at least one light-transmitting area and a wiring area, and the wiring area at least partially surrounds the at least one light-transmitting area. The display area includes pixel circuits and driving signal lines electrically connected with the pixel circuits. A driving signal line includes a first segment in the display area, a first connection line located in the wiring area, and a second segment located between the at least two non-display areas that are arranged adjacently. The first segment is connected to the second segment through the first connection line and the first segment is at least located at a side of the at least two non-display areas that are arranged adjacently.

29 Claims, 29 Drawing Sheets

(56) References Cited

U.S. PATENT DOCUMENTS

2023/0134347 A1\* 5/2023 Yang .................. H10K 59/1213
257/40
2023/0221606 A1\* 7/2023 Yeh ................... G02F 1/136286
345/206

FOREIGN PATENT DOCUMENTS

| CN | 113410257 A | 9/2021 |
| CN | 114783349 A | 7/2022 |

\* cited by examiner

US 12,069,919 B2

DISPLAY PANEL AND DISPLAY DEVICE

CROSS-REFERENCE TO RELATED APPLICATION

This application claims the priority of Chinese Patent Application No. 202211086396.7, filed on Sep. 6, 2022, the content of which is incorporated herein by reference in its entirety.

TECHNICAL FIELD

The present disclosure generally relates to the field of display technologies and, more particularly, relates to a display panel and a display device.

BACKGROUND

With the development of the information society, the requirements for display devices for displaying information are also increasing. Therefore, users have higher and higher demands for panel display devices with small sizes, light weight, and good display effects.

In recent years, the use of display devices has been diversified and generalized. On the basis that display devices have become thinner and lighter, users have higher and higher requirements for the screen ratio of display devices. Therefore, in the current development of display devices, research aimed at expanding a display area of a display device is becoming more and more important. When the display area of the display device includes two or more components, how to increase the screen ratio of the display device is a technical problem to be solved urgently.

SUMMARY

One aspect of the present disclosure provides a display panel. The display panel includes a display area and at least two non-display areas arranged adjacently along a first direction. The display area at least partially surrounds the non-display areas. Each of the at least two non-display areas includes at least one light-transmitting area and a wiring area, and the wiring area at least partially surrounds the at least one light-transmitting area. The display area includes a plurality of pixel circuits and a plurality of driving signal lines electrically connected with the plurality of pixel circuits. A driving signal line of the plurality of driving signal lines includes a first segment in the display area, a first connection line located in the wiring area, and a second segment located between the at least two non-display areas that are arranged adjacently. The first segment is connected to the second segment through the first connection line and the first segment is at least located at a side of the at least two non-display areas that are arranged adjacently.

Another aspect of the present disclosure provides a display device. The display device includes a display panel. The display panel includes a display area and at least two non-display areas arranged adjacently along a first direction. The display area at least partially surrounds the non-display areas. Each of the at least two non-display areas includes at least one light-transmitting area and a wiring area, and the wiring area at least partially surrounds the at least one light-transmitting area. The display area includes a plurality of pixel circuits and a plurality of driving signal lines electrically connected with the plurality of pixel circuits. A driving signal line of the plurality of driving signal lines includes a first segment in the display area, a first connection line located in the wiring area, and a second segment located between the at least two non-display areas that are arranged adjacently. The first segment is connected to the second segment through the first connection line and the first segment is at least located at a side of the at least two non-display areas that are arranged adjacently.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
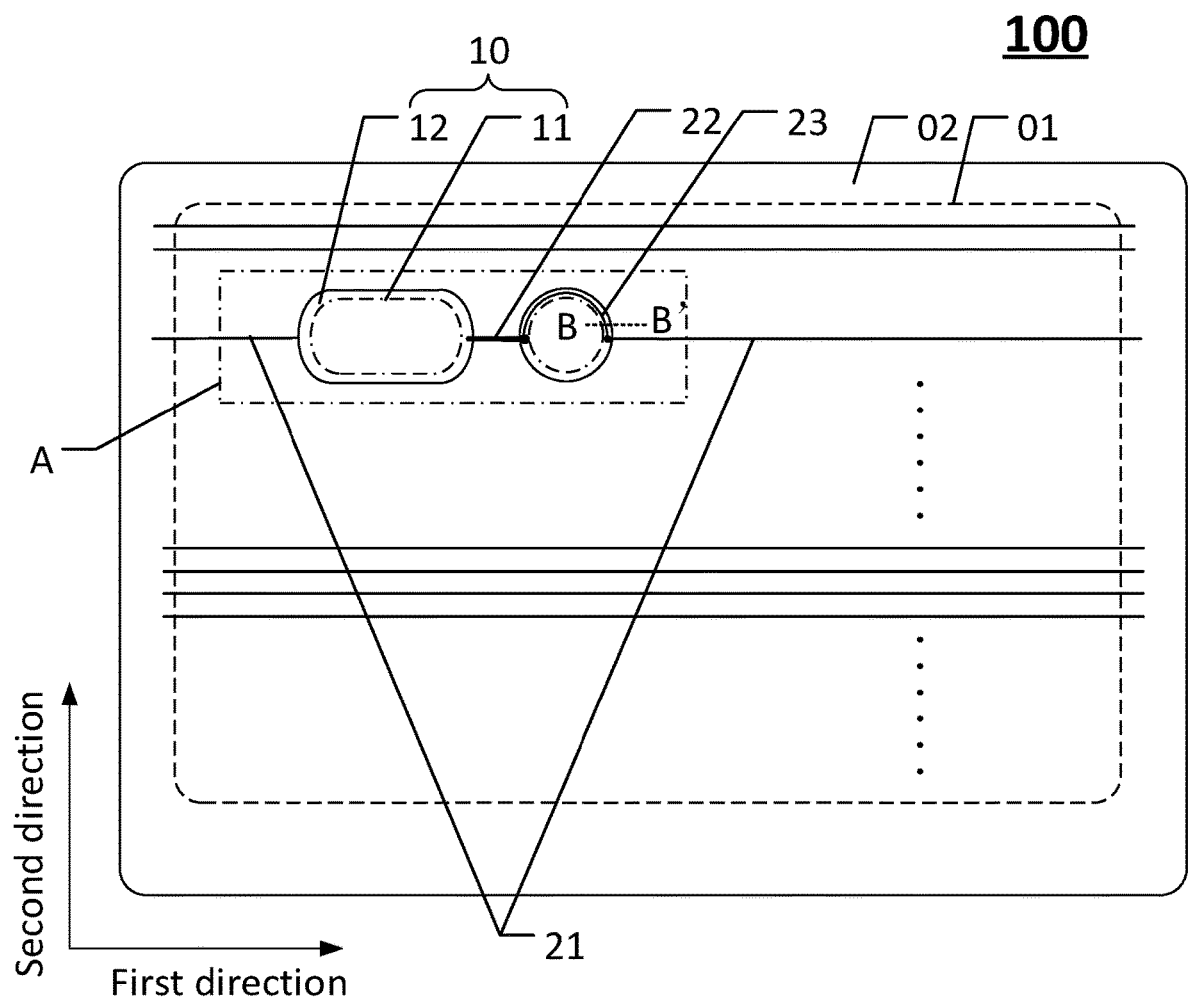
FIG. 1 illustrates an exemplary display panel consistent with various disclosed embodiments of the present disclosure.

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like parts, and a detailed description thereof may be omitted.

Further, in the present disclosure, the disclosed embodiments and the features of the disclosed embodiments may be combined under conditions without conflicts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

Moreover, the present disclosure is described with reference to schematic diagrams. For the convenience of descriptions of the embodiments, the cross-sectional views illustrating the device structures may not follow the common proportion and may be partially exaggerated. Besides, those schematic diagrams are merely examples, and not intended to limit the scope of the disclosure. Furthermore, a three-dimensional (3D) size including length, width, and depth should be considered during practical fabrication.

In recent years, the use of display devices has been diversified and generalized. On the basis that display devices have become thinner and lighter, users have higher and higher requirements for a screen ratio of display devices. Therefore, in the current development of display devices, research aimed at expanding a display area of a display device is becoming more and more important. When the display area of the display device includes two or more components, how to increase the screen ratio of the display device is a technical problem to be solved urgently.

The present disclosure provides a display panel and a display device to increase a screen ratio of a display device including two or more components.

FIG. 1 illustrates an exemplary display panel according to one embodiment of the present disclosure. As shown in FIG. 1, one embodiment of the present disclosure provides a display panel 100. The display panel 100 may include a display area 01, and at least two non-display areas 10 arranged adjacent to each other along a first direction. The display area 01 may at least partially surround the at least two non-display areas 10.

The at least two non-display areas 10 may at least include a light transmission area 11 and a wiring area 12. The wiring area 12 may at least partially surround the light transmission area 11.

The display area may include a plurality of pixel circuits and a plurality of driving signal lines electrically connected to the plurality of pixel circuits.

One driving signal line of the plurality of driving signal lines may include a first segment 21 in the display area 01, a first connection line 23 in the wiring area 12, and a second segment 22 between adjacent non-display areas of the at least two non-display areas 10. The first segment 21 may be connected to the second segment 22 through the first connection line 23.

The first segment 21 may be located at least one side of the at least two non-display areas that are arranged adjacently 10.

Specifically, as shown in FIG. 1, the present embodiment provides a display panel 100. The display panel 100 may include the display area 01 and the at least two non-display areas 10. The display area 01 may surround the at least two non-display areas 10. The at least two non-display areas 10 may be arranged adjacent to each other along the first direction. Each non-display area 10 may include at least one light-transmitting area 11 and a wiring area 12 surrounding the at least one light-transmitting area 11. The at least one light-transmitting area 11 may be used to set photosensitive devices such as cameras, or components such as speakers. This is not specifically limited in the present disclosure, and the user can choose the specific settings of the at least one light-transmitting area 11 according to requirements. The wiring area 12 may be used for the setting of various wirings required in the display panel 100, mainly to realize the electrical connection of the same type of wirings extending in the same direction on both sides of the wiring area 12, that is, for the realization transmission of the same electrical signal in the same type of wirings extending in the same direction on both sides of the wiring area 12.

The display panel 100 may further include the plurality of pixel circuits located in the display area 01, and the plurality of driving signal lines electrically connected to the plurality of pixel circuits. The plurality of driving signal lines may be used to transmit various types of electrical signals required to the plurality of pixel circuits. The present disclosure does not specifically limit the types of electrical signals that the plurality of driving signal lines can transmit to the plurality of pixel circuits, and users can make corresponding selections according to actual needs.

One embodiment of the present disclosure provides an arrangement method of the plurality of driving signal lines in the display panel 100. Specifically, a driving signal line of the plurality of driving signal lines may include a first segment 21, a first connection line 23 and a second segment 22. The first segment 21 may be located at least one side of the at least two non-display areas that are arranged adjacently 10, the second segment 22 may be located between the adjacent non-display areas 10, and the first connection line 23 may be located in the wiring area 12 of at least one of the at least two non-display areas 10. The first connection line 23 may be used to electrically connect the first segment 21 and the second segment 22, such that electrical signals is able to be transmitted to the second segment 22 through the first segment 21 and the first connection line 23 and the display area 01 between the adjacent non-display areas 10 is able to receive the electrical signals required by relevant pixel circuits of the plurality of pixel circuits. Therefore, the normal driving of the display area 01 between the adjacent non-display areas 10 may be realized. In comparison to a display panel that cannot display a picture between two adjacent non-display areas, the screen ratio of the display device in the present disclosure may be increased and the user experience may be improved.

Figure 2:
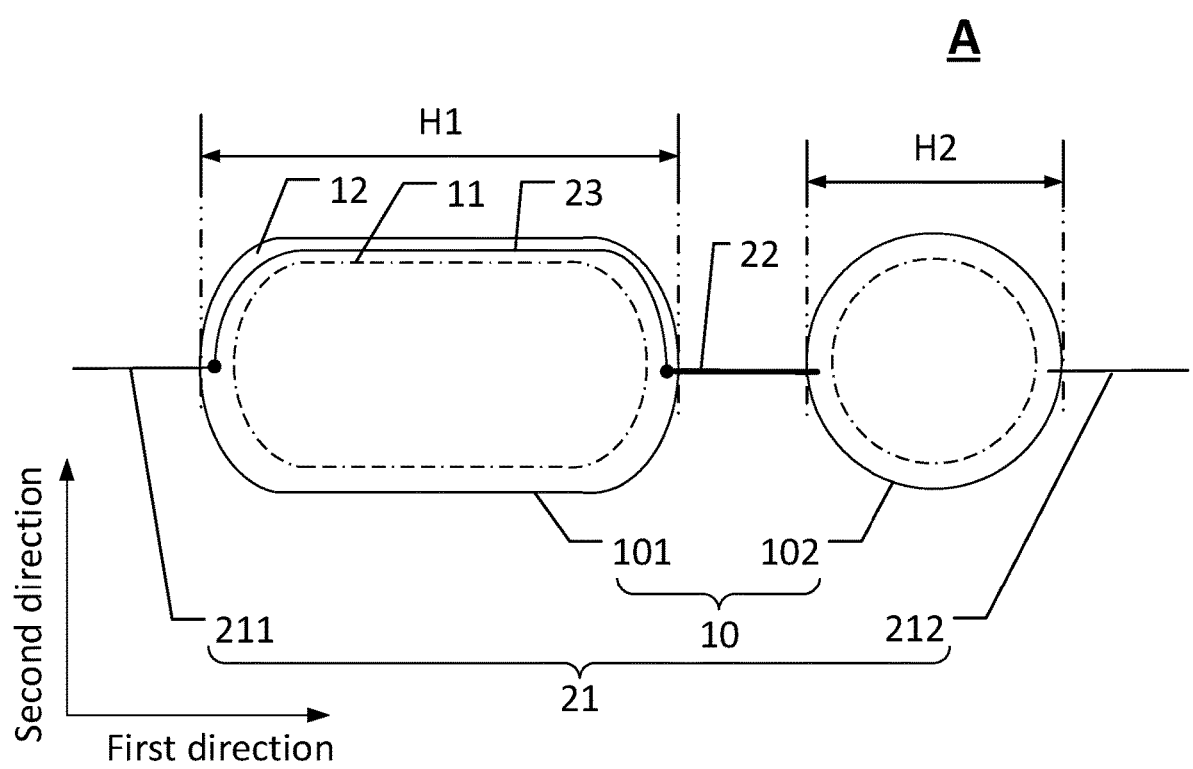
FIG. 2 illustrates an enlarged view of region A in FIG. 1, consistent with various disclosed embodiments of the present disclosure.

FIG. 2 shows an enlarged view of the region A in the display panel in FIG. 1. In one embodiment shown in FIG. 1 and FIG. 2, the first segment 21 may include a first sub-first-segment 211 located at a first side of the at least two non-display areas that are arranged adjacently 10 and a second sub-first-segment 212 located at a second side of the at least two non-display areas that are arranged adjacently 10.

The first sub-first-segment 211 may be connected to the second segment 22 through the first connection line 23.

Specifically, the present embodiment provides an optional implement where the first segment 21 is a two-segment type. Specifically, the first segment 21 may include the first sub-first-segment 211 and the second sub-first-segment 212. Along the first direction, the first sub-first-segment 211 and the second sub-first-segment 212 may be respectively arranged at the first side and the second side of the at least two non-display areas that are arranged adjacently 10. Therefore, only the first sub-first-segment 211 may be configured to be connected to the second segment 22 through the first connection line 23, and the second sub-first-segment 212 may only be located at the second side of the at least two non-display areas that are arranged adjacently 10. In this configuration, the pixel circuits between the two adjacent non-display areas 10 may be electrically connected through the first sub-first-segment 211, the first connection line 23, and the second segment 22, to transmit relevant electrical signals to the pixel circuits and realize the normal driving of the display area 01 between the adjacent non-display areas 10. In comparison with a display panel that cannot display a picture between the two adjacent non-display areas, the performance of the related display device may be improved and the screen ratio may be increased, to improve the user experience.

Figure 3:
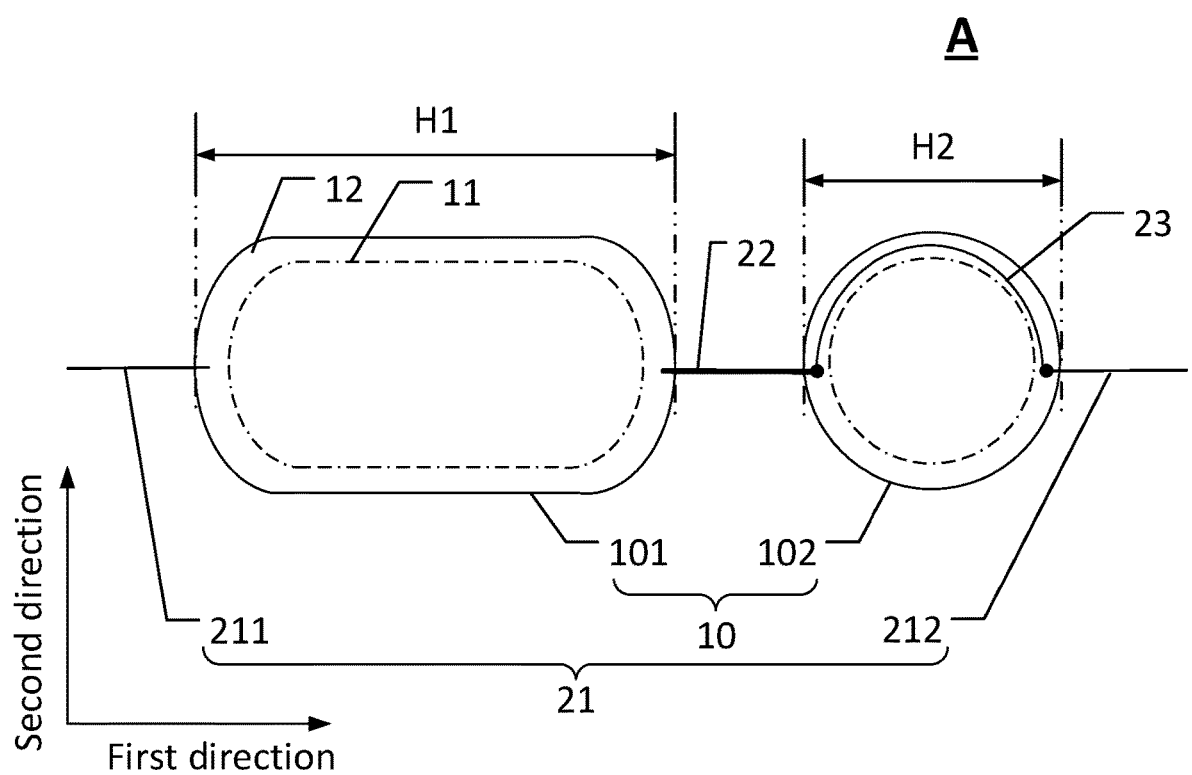
FIG. 3 illustrates another enlarged view of the region A in FIG. 1, consistent with various disclosed embodiments of the present disclosure.

FIG. 3 shows another enlarged view of the region A in the display panel in FIG. 1. In one embodiment shown in FIG. 1 and FIG. 3, the at least two non-display areas 10 arranged adjacently may include a first non-display area 101 and a second non-display area 102. Along the first direction, a width H1 of the first non-display area 101 may be larger than a width H2 of the second non-display area 102.

The first connection line 23 may be located in the second non-display area 102.

Specifically, in the present embodiment, the display panel 100 may include a first non-display area 101 and a second non-display area 102 that are arranged adjacently. A size of the first non-display area 101 along the first direction and a size of the second non-display area 102 along the first direction may be different. Optionally, the width H1 of the first non-display area 101 along the first direction may be larger than the width H2 of the second non-display area 102. The shapes of the first non-display area 101 and the second non-display area 102 are not limited specifically in the present disclosure, and the two non-display areas 10 may be set to have the same shape or different shapes, which can be adjusted by the users accordingly.

As shown in FIG. 3, in one embodiment, the first non-display area 101 and the second non-display area 102 may be configured to have different shapes. Therefore, optionally, the first connection line 23 may be only located in the wiring area 12 included only in the second non-display area 102. For example, in one embodiment, the second side of the above-mentioned two non-display areas 10 may be a side of the second non-display area 102 away from the first non-display area 101. Correspondingly, the first connection line 23 is used to electrically connect the second sub-first-segment 212 and the second segment 22. The second sub-first-segment 212, the first connection line 23, and the second segment 22 may be electrically connected, to transmit relevant electrical signals to the pixel circuits between the first non-display area 101 and the second non-display areas 102 and realize normal driving of the display areas 01 between the adjacent non-display areas 10. The pixel circuits at a side of the first non-display area 101 away from the second non-display area 102 may be driven by the first sub-first-segment 211. In comparison with a display panel that cannot display a picture between the two adjacent non-display areas, the performance of the related display device may be improved and the screen ratio may be increased, to improve the user experience.

For description purposes only, the embodiments shown in FIG. 1 to FIG. 3 where the first non-display area 101 is in the shape of a racetrack and the second non-display area 102 is circular, are used as examples to illustrate the present disclosure, and do not limit the scope of the present disclosure. In some other embodiments, the at least two non-display areas 10 may have other suitable shapes.

As shown in FIG. 1 and FIG. 2, in another embodiment, the at least two non-display areas 10 arranged adjacently may include a first non-display area 101 and a second non-display area 102. Along the first direction, a width H1 of the first non-display area 101 may be larger than a width H2 of the second non-display area 102.

The first connection line 23 may be located in the first non-display area 101.

Specifically, in the present embodiment, the display panel 100 may include a first non-display area 101 and a second non-display area 102 that are arranged adjacently. A size of the first non-display area 101 along the first direction and a size of the second non-display area 102 along the first direction may be different. Optionally, the width H1 of the first non-display area 101 along the first direction may be larger than the width H2 of the second non-display area 102. The shapes of the first non-display area 101 and the second non-display area 102 are not limited specifically in the present disclosure, and the two non-display areas 10 may be set to have the same shape or different shapes, which can be adjusted by the users accordingly.

As shown in FIG. 2, in one embodiment, the first non-display area 101 and the second non-display area 102 may be configured to have different shapes. Therefore, optionally, the first connection line 23 may be only located in the wiring area 12 in the first non-display area 101. For example, in one embodiment, the first side of the above-mentioned two non-display areas 10 may be a side of the first non-display area 101 away from the second non-display area 102. Correspondingly, the first connection line 23 is used to electrically connect the first sub-first-segment 211 and the second segment 22. The first sub-first-segment 211, the first connection line 23, and the second segment 22 may be electrically connected, to transmit relevant electrical signals to the pixel circuits between the first non-display area 101 and the second non-display areas 102 and realize normal driving of the display areas 01 between the adjacent non-display areas 10. The pixel circuits at a side of the first non-display area 101 away from the second non-display area 102 may be driven by the second sub-first-segment 212. In comparison with a display panel that cannot display a picture between the two adjacent non-display areas, the performance of the related display device may be improved and the screen ratio may be increased, to improve the user experience.

In the first direction, when the width H1 of the first non-display area 101 is larger than the width H2 of the second non-display area 102, in response to the wiring corresponding to the non-display area 10 extending in the first direction with single-side driving, the present disclosure does not limit whether the electrical signal received by the second segment 22 is transmitted by the first sub-first segment 211 or the second sub-first segment 212, as long as the second segment 22 is able to transmit the relevant electrical signal to the pixel circuits between the first non-display area 101 and the second non-display area 102. When the width of the wiring area 12 corresponding to the first non-display area 101 and the width of the wiring area 12 corresponding to the second non-display area 102 care different, the first connection line 23 may be disposed in one of the wiring areas 12 which is able to better meet the wiring requirements. Or the user may also choose whether the first connection line 23 is located in the first non-display area 101 or the second non-display area 102, or both in the first non-display area 101 and the second non-display area 102 according to other design requirements. "unilateral driving" may mean that the wires that are electrically connected to a same row of pixel units and used to transmit the same electrical signal may have a disconnected area along the extension direction along the first direction. For example, the disconnected area may be located at both sides of the second non-display area 102 in one embodiment shown in FIG. 2, or the disconnected area may be located at both sides of the first non-display area 101 in another embodiment shown in FIG. 2.

Figure 4:
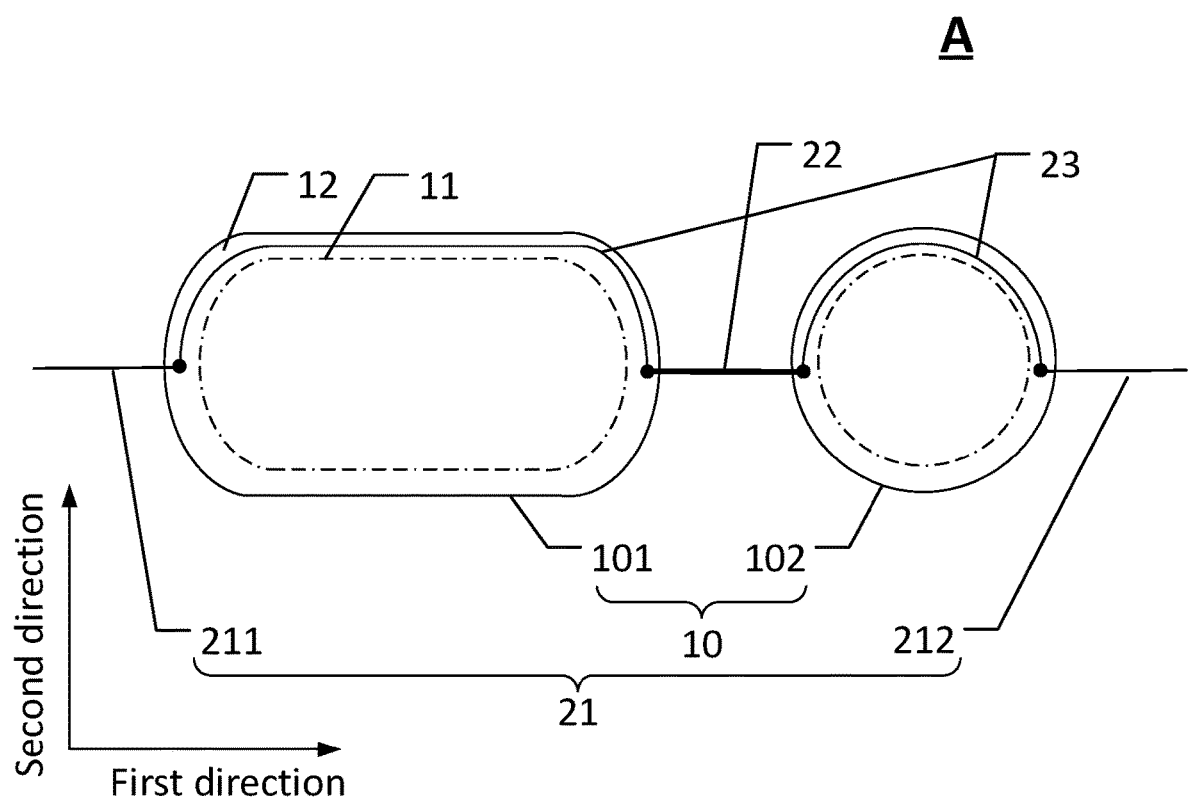
FIG. 4 illustrates another enlarged view of the region A in FIG. 1, consistent with various disclosed embodiments of the present disclosure.

FIG. 4 shows an enlarged view of the region A in the display panel in FIG. 1. In one embodiment shown in FIG. 1 and FIG. 4, the first segment 21 may include a first sub-first-segment 211 located at a first side of the at least two non-display areas that are arranged adjacently 10 and a second sub-first-segment 212 located at a second side of the at least two non-display areas that are arranged adjacently 10.

The first sub-first-segment 211 may be connected to a first end of the second segment 22 through the first connection line 23, and the second sub-first-segment 212 may be connected to a second end of the second segment 22 through the first connection line 23.

Specifically, the present embodiment provides an optional implement where the first segment 21 is a two-segment type. Specifically, the first segment 21 may include the first sub-first-segment 211 and the second sub-first-segment 212. Along the first direction, the first sub-first-segment 211 and the second sub-first-segment 212 may be respectively arranged at the first side and the second side of the at least two non-display areas that are arranged adjacently 10. The first sub-first-segment 211 may be configured to be electrically connected to the first end of the second segment 22 through the first connection line 23, and the second sub-first-segment 212 may be electrically connected to the second end of the second segment 22 through the first connection line 23. In this configuration, the pixel circuits between the two adjacent non-display areas 10 may be able to be driven bilaterally by the plurality of driving signal lines, that is, the five-segment signal lines including the first sub-first-segment 211, the first connection line 23, the second segment 22 the first connection line 23, and the second sub-first-segment 212 may be electrically connected to transmit the relevant electrical signals to the pixel circuits between the adjacent non-display areas 10, to realize the normal driving of the display area 01 between the adjacent non-display areas 10. In comparison with a display panel that cannot display a picture between the two adjacent non-display areas, the performance of the related display device may be improved and the screen ratio may be increased, to improve the user experience.

Figure 5:
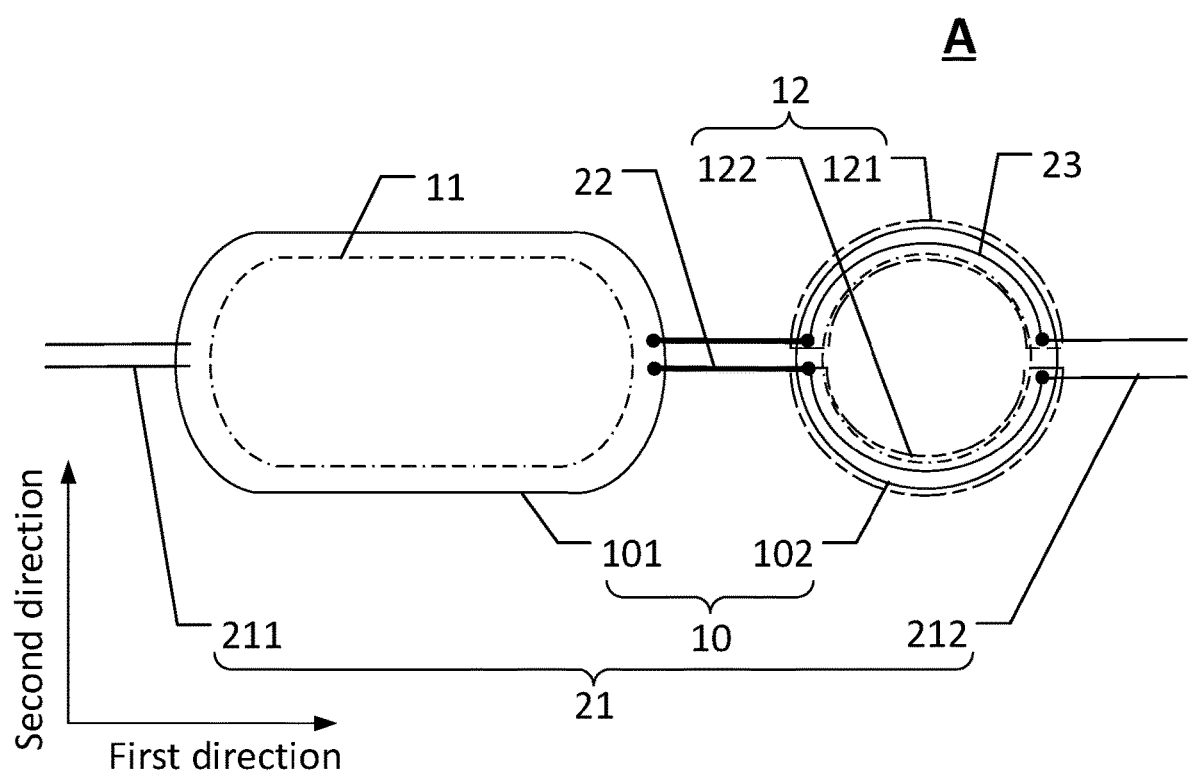
FIG. 5 illustrates another enlarged view of the region A in FIG. 1, consistent with various disclosed embodiments of the present disclosure.
Figure 6:
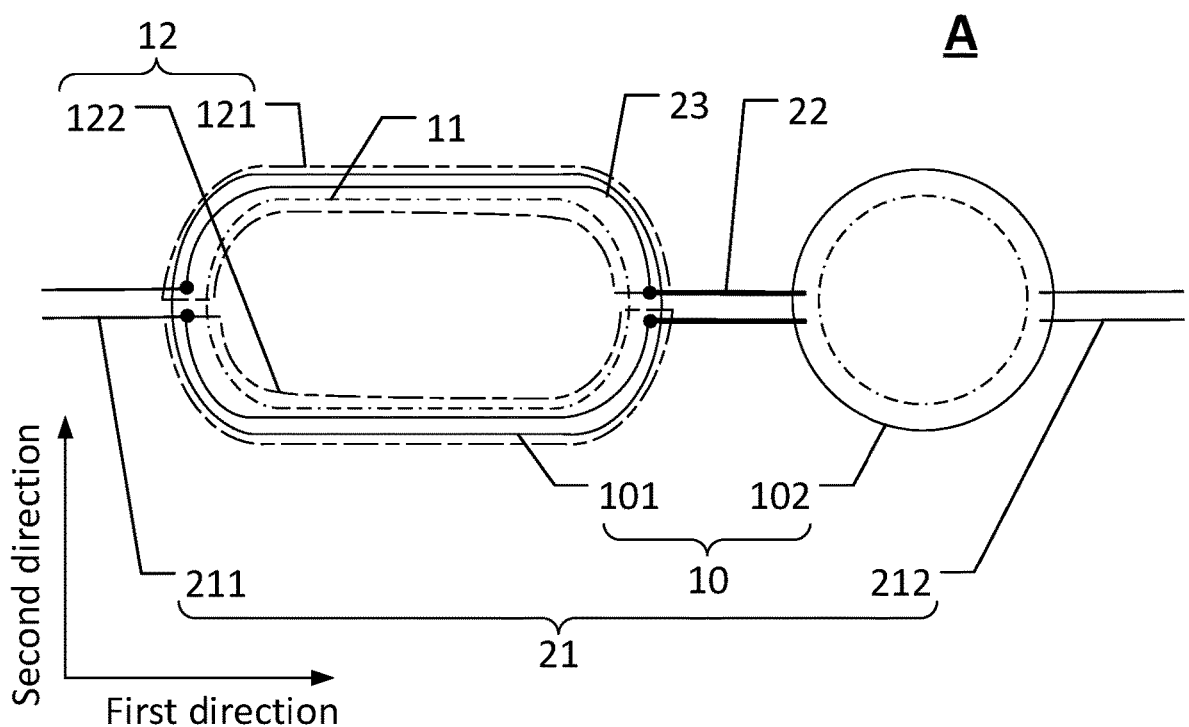
FIG. 6 illustrates another enlarged view of the region A in FIG. 1, consistent with various disclosed embodiments of the present disclosure.
Figure 7:
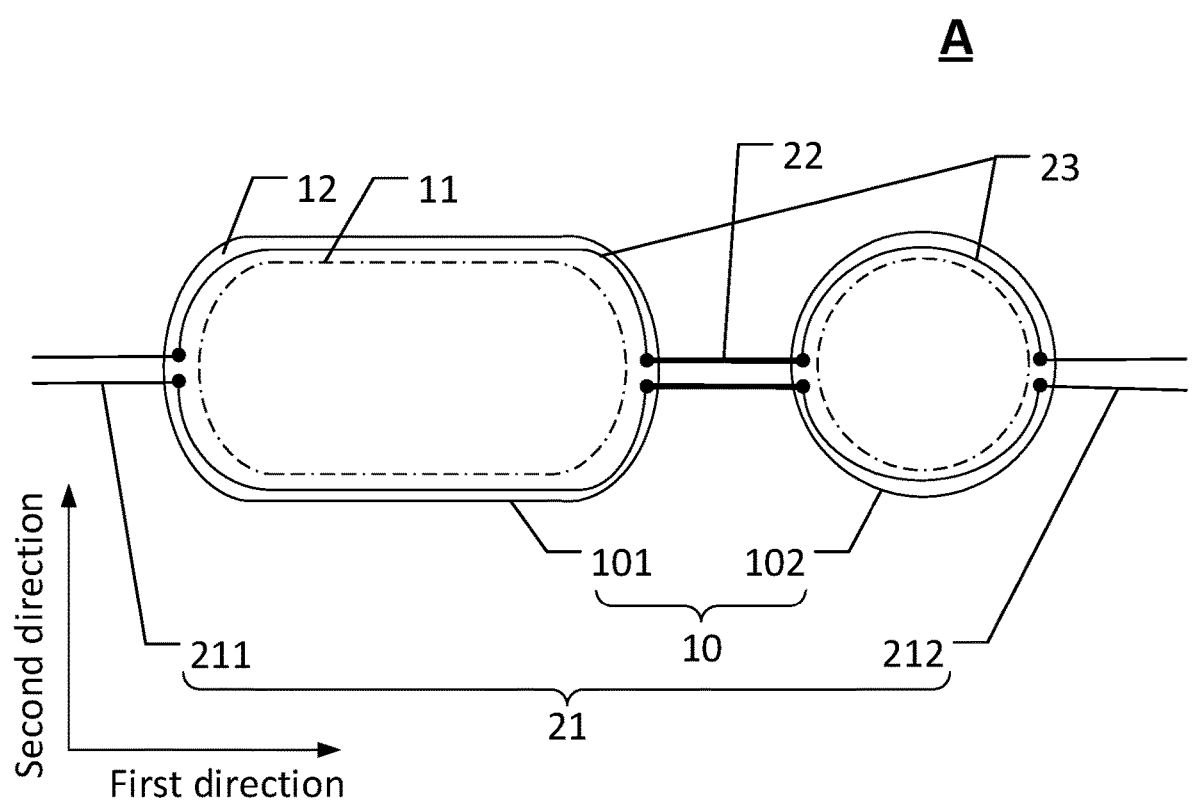
FIG. 7 illustrates another enlarged view of the region A in FIG. 1, consistent with various disclosed embodiments of the present disclosure.

FIG. 5 shows an enlarged view of the region A in the display panel in FIG. 1, FIG. 6 shows an enlarged view of the region A in the display panel in FIG. 1, and FIG. 7 shows an enlarged view of the region A in the display panel in FIG. 1. As shown in FIG. 1 to FIG. 7, in one embodiment, along a second direction, the wiring area 12 includes a first wiring area 121 and a second wiring area 122 located at two sides of the light-transmitting area 11 respectively. The second direction may intersect the first direction.

Both the first wiring area 121 and the first wiring area 121 may include driving signal lines.

Specifically, as shown in the three embodiments shown in FIG. 5 to FIG. 7, the display panel 100 may include the at least two non-display areas that are arranged adjacently 10, and each non-display area 10 may include the wiring area 12 and the light-transmitting area 11. The wiring area 12 may at least partially surround the light-transmitting area 11. In the second direction, the wiring area 12 may include the first wiring area 121 and the second wiring area 122 at two sides of the light-transmitting area 11 respectively. That is, along the second direction, the wiring area 12 may be disposed at both sides of the light-transmitting area 11, to be used for the wiring of the first connection line 23. For example, in the second non-display area 102 shown in FIG. 5, the first wiring area 121 and the second wiring area 122 may both be used to accommodate the driving signal lines, that is, the driving signal lines may include the first connection line 23.

For description purposes only, the embodiment where the first wiring area 121 and the second wiring area 122 at two sides of the light-transmitting area 11 are both used for accommodating the driving signal lines is used as an example to illustrate the present disclosure, and the present disclosure is not limited thereto. In some other embodiment, when the space of the wiring areas 12 of the at least two non-display areas 10 allows, the user may also set a single-side wiring according to the requirements. For example, the first connection line 23 of the driving signal line shown in FIG. 2 to FIG. 4 may be only located in the first wiring area 121 or the second wiring area 122.

As shown in FIG. 5 to FIG. 7 in conjunction with FIG. 1, in one embodiment, along the second direction, the first connection lines 23 may be arranged in a symmetrical number at both sides of the light-transmitting area 11.

Specifically, when the first wiring area 121 and the second wiring area 122 are disposed at two sides of the light-transmitting area 11 respectively, in one embodiment, the numbers of the first connection lines 23 located at two sides of the light-transmitting area 11 may be symmetric. For example, as shown in FIG. 5, only the wiring area 12 corresponding to the second non-display area 102 may be provided with the first connection line 23, and the numbers of the first connection lines 23 included in the first wiring area 121 and the second wiring area 122 corresponding to the second non-display area 102 may be the same, that is, may be symmetrically arranged.

It should be noted that the "symmetrical number" here includes at least two meanings. In one meaning, for example, the numbers of the first connection lines 23 included in the first wiring area 121 and the second wiring area 122 corresponding to the second non-display area 102 may be the same. In another meaning, for example, the difference between the numbers of the first connection lines 23 included in the first wiring area 121 and the second wiring area 122 corresponding to the second non-display area 102 may be one. In one specific example, when the number of driving signal lines including the first connection lines 23 is 60, 30 first connection lines 23 may be arranged in the first wiring area 121 and 30 first connection lines 23 in the second wiring area 122. In another example, when the number of the driving signal lines including the first connection lines 23 is 61, 30 first connection lines 23 may be set in the first wiring area 121, and 31 first connection lines 23 may be set in the second wiring area 122.

Figure 8:
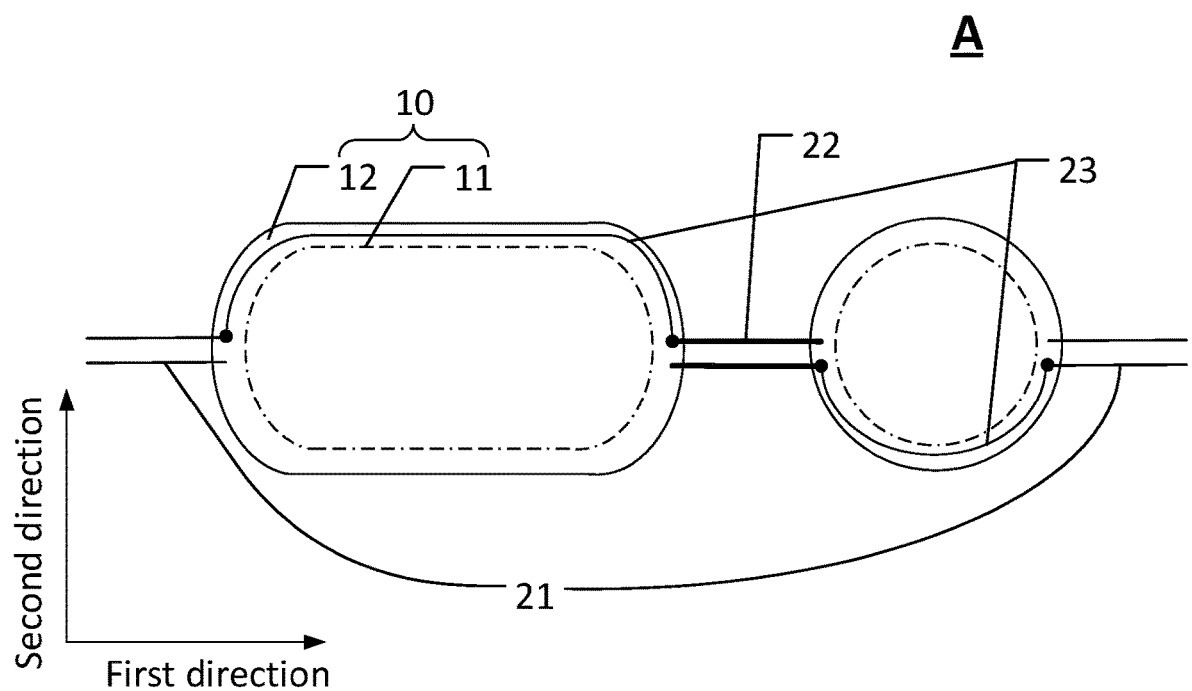
FIG. 8 illustrates another enlarged view of the region A in FIG. 1, consistent with various disclosed embodiments of the present disclosure.

FIG. 8 shows an enlarged view of the region A in the display panel in FIG. 1. As shown in FIG. 8, in one embodiment, the driving signal lines may be disposed in both the first wiring area 121 and the second wiring area 122. The first connection lines 23 may be arranged not symmetrically in the at least two non-display areas 10. For example, as shown in FIG. 8, a portion of the first connection lines 23 may be located in the wiring area 12 of one of the at least two non-display areas 10, and another portion of the first connection lines 23 may be arranged in the wiring area 12 of another one of the at least two non-display areas 10.

Figure 9:
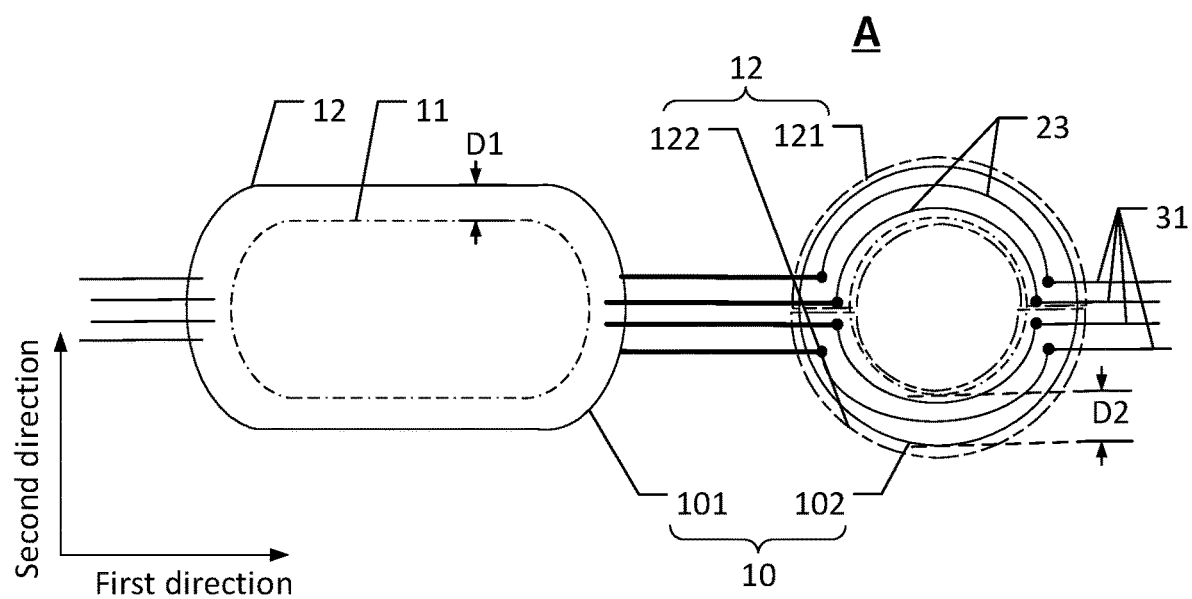
FIG. 9 illustrates another enlarged view of the region A in FIG. 1, consistent with various disclosed embodiments of the present disclosure.
Figure 10:
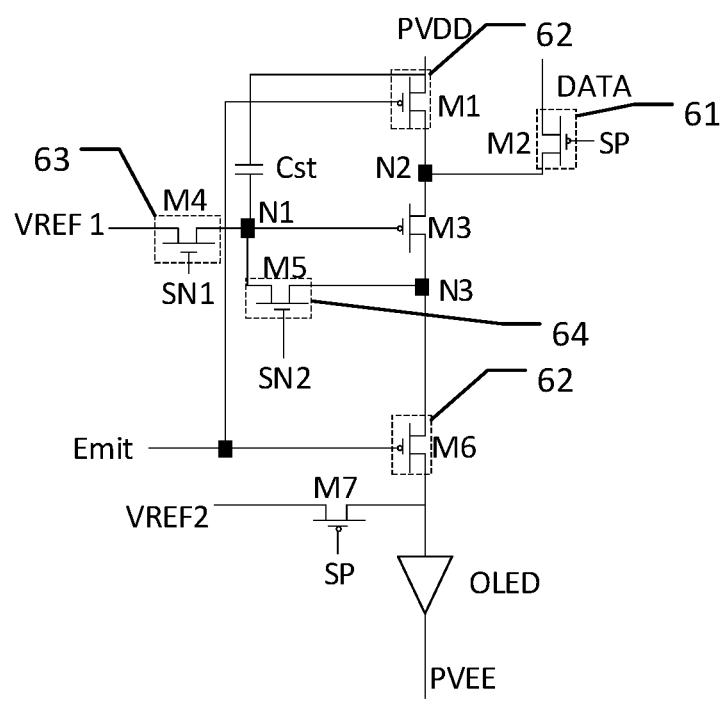
FIG. 10 illustrates a circuit diagram of an exemplary pixel circuit consistent with various disclosed embodiments of the present disclosure.

FIG. 9 shows another enlarged view of the region A in FIG. 1, and FIG. 10 is a circuit diagram of an exemplary pixel circuit. Optionally, as shown in FIG. 1 to FIG. 10, one pixel circuit 70 may include a data writing module 61, and the driving signal lines may include scan lines 31 electrically connected to data writing modules 61. The first connection lines 23 corresponding to the scan lines may be disposed in both the first wiring area 121 and the second wiring area 122 including the first portion of the scan line 31.

Specifically, each pixel circuit 70 included in the display panel 100 may include one data writing module 61, and each data writing module 61 may need to be electrically connected to a corresponding driving signal line, to realize the transmission of relevant electrical signals of the pixel circuit 70. The type of the driving signal line electrically connected to the data writing module 61 may be specifically the scan line 31.

In one embodiment, the pixel circuits 70 between at least two non-display areas that are arranged adjacently 10 may also need to transmit electrical signals through the scan lines 31. Therefore, at least a portion of the scan lines 31 may include the first connection lines 23 to assist with the transmission of the electrical signals in the pixel circuits 70 between the at least two non-display areas 10. Therefore, the first wiring area 121 and the second wiring area 122 at two sides of the light-transmitting area 11 may be set to include the first connection lines 23 of the scan lines 31, such that the wiring areas 12 at two sides of the light-transmitting region 11 are able to be used. As shown in FIG. 9, the numbers of the first connection lines 23 of the scan lines passing through the first wiring area 121 and the second wiring area 122 may be configured to be symmetrical, such that the areas of the wiring areas 12 occupied by the scanning lines 31 in the first wiring area 121 and the second wiring area 122 may be similar. Therefore, a situation where the numbers of wiring arrangements in the first wiring area 121 and the second wiring area 122 are greatly different may be avoided, to rationalize the wiring distribution and make the corresponding non-display areas 10 appear as a symmetrical figure. The aesthetics of the display panel 100 may be improved.

For example, when the first connection lines 23 of the scan lines 31 are all located in the second non-display area 102, each half of the first connection lines may be disposed in each of the first wiring area 121 and the second wiring area 122 corresponding to the second non-display area 102. It should be noted that, specifically, the numbers of the first connection lines 23 disposed in the first wiring area 121 and the second wiring area 122 respectively corresponding to the second non-display area 102 may be set to be the same; or, the difference between the numbers of the first connection lines 23 disposed in the first wiring area 121 and the second wiring area 122 respectively corresponding to the second non-display area 102 may be one.

Figure 11:
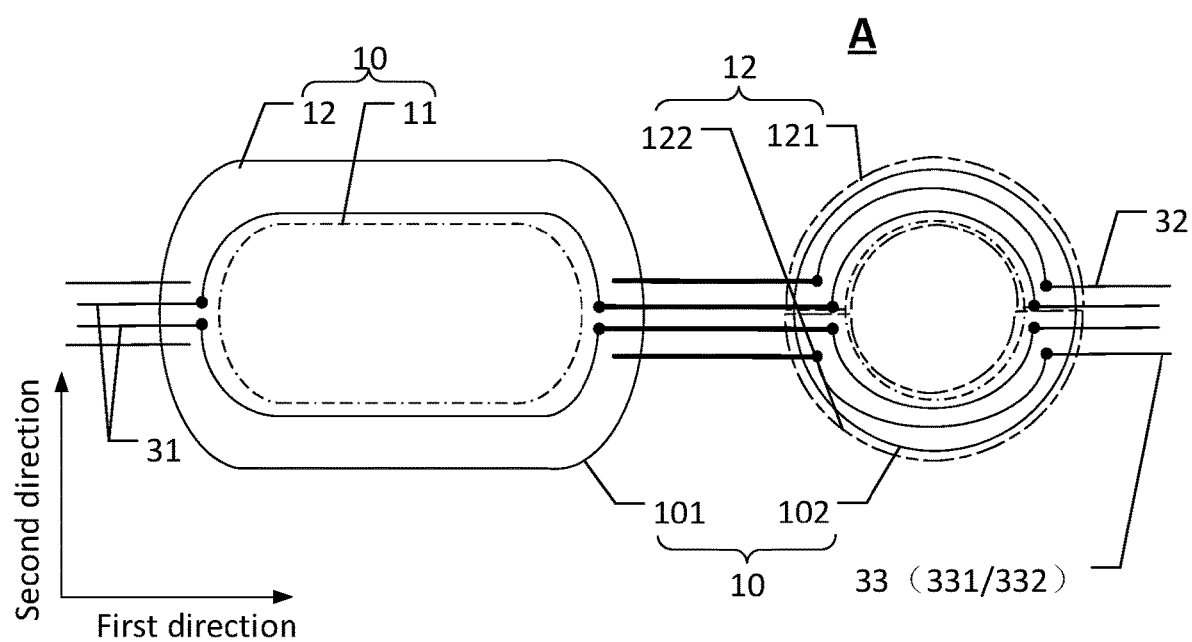
FIG. 11 illustrates another enlarged view of the region A in FIG. 1, consistent with various disclosed embodiments of the present disclosure.

FIG. 11 shows another enlarged view of the region A in FIG. 1. In one embodiment shown in FIG. 1 and FIG. 11, one pixel circuit 70 may further include a light-emitting control module 62, a reset module 63, and a compensation module 64. The driving signal lines may further include a light-emitting control signal line 32 and a circuit control signal line 33. The circuit control signal line 33 may include a first circuit control line 331 and a second circuit control signal line 33.

The light-emitting control signal line 32 may be electrically connected with the light-emitting control module 62, the first circuit control line 331 may be electrically connected with the reset module 63, and the second circuit control line 332 may be electrically connected with the compensation module 64.

The first connection lines 23 of the light-emitting control signal lines 32 may be all located in the first wiring area 121, and the first connection lines 23 of the circuit control signal lines 33 may be all located in the second wiring area 122.

Specifically, one pixel circuit 70 in the display panel 100 may at least include, in addition to the data writing module 61, one light-emitting control module 62, one reset module 63, and one compensation module 64. The driving signal line electrically connected to the data writing module 61 may be specifically the scan line 31, the driving signal line electrically connected with the light-emitting control module 62 may be specifically the light-emitting control signal line 32, the driving signal line electrically connected with the reset module 63 may be specifically the first circuit control line 331, and the driving signal line electrically connected to the compensation module 64 may be specifically the second circuit control line 332. That is, in one embodiment, the types of the driving signal lines may at least include three types including the scan lines 31, the light-emitting control signal lines 32 and the circuit control signal lines 33. The present embodiment shown in FIG. 11 is used as an example only to illustrate the present disclosure, and does not limit the scope of the present disclosure. In various embodiments, the types of the driving signal lines may be adjusted according to the specific design of the display panel 100, which is not specifically limited in the present disclosure.

In one embodiment, a number of the scan lines 31 including the first connection lines 23 may be 2X, a number of the light-emitting control signal lines 32 including the first connection lines 23 may be X, and a number of the circuit control signal lines 33 including the first connection lines 23 may be X. Therefore, when the first connection lines 23 included in the aforementioned driving signal lines with a number of 4X are all located in the wiring area 12 included in the second non-display area 102, X scan lines 31 and X light-emitting control signal lines 32 may be disposed in the first wiring area 121 of the second non-display area 102, and X scan lines 31 and X circuits control signal line 33 may be disposed in the second wiring area 122 of the second non-display area 102.

Correspondingly, the first connection lines 23 included in the second non-display area 102 may be evenly distributed in the first wiring area 121 and the second wiring area 122 of the second non-display area 102, to avoid a large difference in the numbers of wirings in the first wiring area 121 and in the second wiring area 122. Therefore, the wiring distribution may be rationalized. Further, the corresponding non-display area 10 may be rendered as a symmetrical shape, therefore improving the aesthetics of the display panel 100. At the same time, the same type of signal wires with a small number may be disposed in the wiring area 12 (the first wiring area 121 or the second wiring area 122) at a same side of the light-transmitting area 11 as much as possible, facilitating unified fabrication of various types of wirings of the display panel 100 and avoid the increase of the fabrication difficulty of the display panel 100.

The embodiment shown in FIG. 11 where the scanning lines 31 are driven on both sides while the light-emitting control signal lines 32 and the circuit control signal lines 33 are driven on one side, is used as an example only to illustrate the present disclosure, and does not limit the scopes of the present disclosure.

Figure 12:
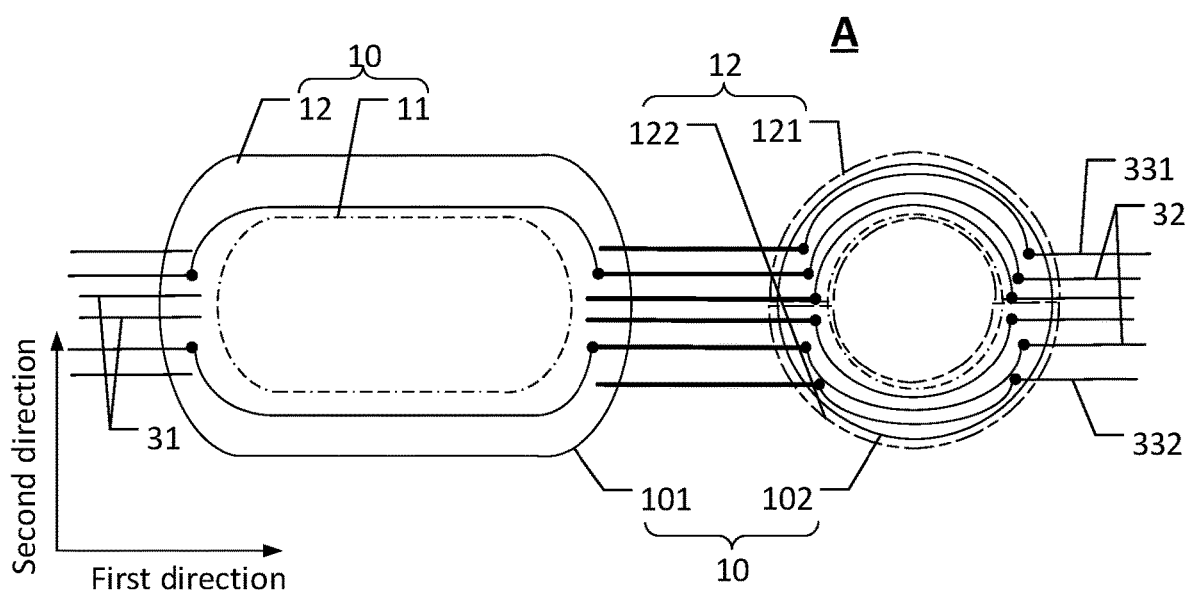
FIG. 12 illustrates another enlarged view of the region A in FIG. 1, consistent with various disclosed embodiments of the present disclosure.

FIG. 12 shows another enlarged view of the region A in FIG. 1. In one embodiment shown in FIG. 1 and FIG. 12, one pixel circuit 70 may further include a light-emitting control module 62, a reset module 63, and a compensation module 64. The driving signal lines may further include a light-emitting control signal line 32 and a circuit control signal line 33. The circuit control signal line 33 may include a first circuit control line 331 and a second circuit control signal line 332.

The light-emitting control signal line 32 may be electrically connected with the light-emitting control module 62, the first circuit control line 331 may be electrically connected with the reset module 63, and the second circuit control line 332 may be electrically connected with the compensation module 64.

The first wiring area 121 may include the first connection lines 23 of the first circuit control signal lines 331 and the first connection lines 23 of at least a portion of the light-emitting control signal lines 32. The second wiring area 122 may include the first connection lines 23 of the second circuit control signal lines 332 and the first connection lines 23 of at least a portion of the light-emitting control signal lines 32.

Specifically, one pixel circuit 70 in the display panel 100 may at least include, in addition to the data writing module 61, one light-emitting control module 62, one reset module 63, and one compensation module 64. The driving signal line electrically connected to the data writing module 61 may be specifically the scan line 31, the driving signal line electrically connected with the light-emitting control module 62 may be specifically the light-emitting control signal line 32, the driving signal line electrically connected with the reset module 63 may be specifically the first circuit control line 331, and the driving signal line electrically connected to the compensation module 64 may be specifically the second circuit control line 332. That is, in one embodiment, the types of the driving signal lines may at least include three types including the scan lines 31, the light-emitting control signal lines 32 and the circuit control signal lines 33. The present embodiment shown in FIG. 11 is used as an example only to illustrate the present disclosure, and does not limit the scope of the present disclosure. In various embodiments, the types of the driving signal lines may be adjusted according to the specific design of the display panel 100, which is not specifically limited in the present disclosure.

In one embodiment, a number of the scan lines 31 including the first connection lines 23 may be 2X, a number of the light-emitting control signal lines 32 including the first connection lines 23 may be X, a number of the first circuit control signal lines 331 including the first connection lines 23 may be X/2, and a number of the second circuit control signal lines 332 including the first connection lines 23 may be X/2. Therefore, when the first connection lines 23 included in the aforementioned driving signal lines with a number of 4X are all located in the wiring area 12 included in the second non-display area 102, X scan lines 31, X/2 light-emitting control signal lines 32, and X/2 first circuit control lines 331 may be disposed in the first wiring area 121 of the second non-display area 102. The same number of first connection lines 23 as the first wiring area 121 may be disposed in the second wiring area 122 of the second non-display area 102. That is, X scan lines 31, X/2 light-emitting control signal lines 32, and X/2 second circuits control signal line 332 may be disposed in the second wiring area 122 of the second non-display area 102.

Correspondingly, the first connection lines 23 included in the second non-display area 102 may be evenly distributed in the first wiring area 121 and the second wiring area 122 of the second non-display area 102, to avoid a large difference in the numbers of wirings in the first wiring area 121 and in the second wiring area 122. Therefore, the wiring distribution may be rationalized. Further, the corresponding non-display area 10 may be rendered as a symmetrical shape, therefore improving the aesthetics of the display panel 100. At the same time, the same type of signal wires with a small number may be disposed in the wiring area 12 (the first wiring area 121 or the second wiring area 122) at a same side of the light-transmitting area 11 as much as possible, facilitating unified fabrication of various types of wirings of the display panel 100 and avoid the increase of the fabrication difficulty of the display panel 100.

The embodiment shown in FIG. 12 where the light-emitting control signal lines 32 are driven on both sides while the scanning lines 31 and the circuit control signal lines 33 are driven on one side, is used as an example only to illustrate the present disclosure, and does not limit the scopes of the present disclosure.

As shown in FIG. 1, FIG. 3, FIG. 9, and FIG. 12, in one embodiment, the at least two non-display areas 10 arranged adjacently may include a first non-display area 101 and a second non-display area 102. Along the first direction, a width H1 of the first non-display area 101 may be larger than a width H2 of the second non-display area 102.

The first connection lines 23 included in the scan lines 31 may be all located in the second non-display area 102.

Specifically, in the present embodiment, the display panel 100 may include the first non-display area 101 and the second non-display area 102 that are arranged adjacently. A size of the first non-display area 101 along the first direction may be different from a size of the second non-display area 102 along the first direction. Optionally, the width H1 of the first non-display area 101 along the first direction may be larger than the width H2 of the second non-display area 102 along the first direction. The shapes of the first non-display area 101 and the second non-display area 102 are not limited in the present disclosure. The two non-display areas 10 may be set to have the same shape or different shapes. Users may set the shape according to actual design requirements.

As shown in FIG. 9 and FIG. 12, in one embodiment, the shapes of the first non-display area 101 and the second non-display area 102 may be different. At this time, it may be configured that the first connection lines 23 included in the scan lines 31 may be all disposed in the wiring area 12 of the second non-display area 102.

Specifically, the first wiring area 121 of the second non-display area 102 may be configured to accommodate half of the first connection lines 23 included in the scan lines 31, and then the second wiring area 122 of the second non-display area 102 may be configured to accommodate other half of the first connection lines 23 included in the scan lines 31. Therefore, the first connection lines 23 included in the scan lines 31 may be evenly disposed in the first wiring area 121 and the second wiring area 122 of the second non-display area 102, to avoid the situation where the numbers of wiring settings in the first wiring area 121 and the second wiring area 122 is quite different. The wiring distribution may be rationalized. Also, the corresponding non-display area 10 may be configured as a symmetrical shape, improving the aesthetics of the display panel 100.

Figure 13:
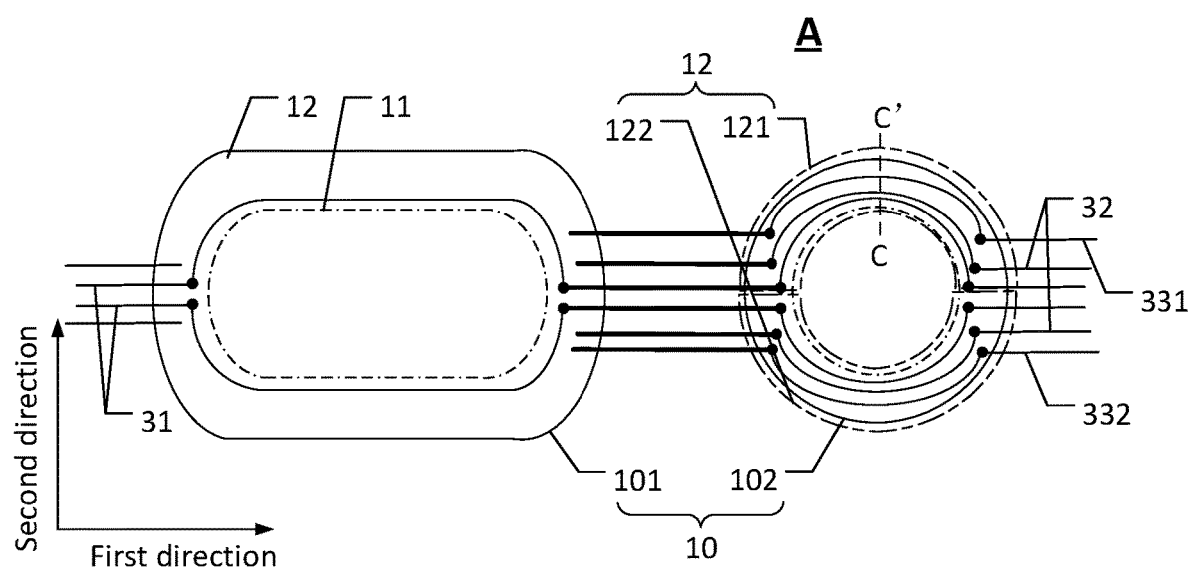
FIG. 13 illustrates another enlarged view of the region A in FIG. 1, consistent with various disclosed embodiments of the present disclosure.

FIG. 13 shows another enlarged view of the region A in FIG. 1. In one embodiment shown in FIG. 1 and FIG. 13, the at least two non-display areas 10 arranged adjacently may include a first non-display area 101 and a second non-display area 102. Along the first direction, a width H1 of the first non-display area 101 may be larger than a width H2 of the second non-display area 102.

At least a portion of the first connection lines 23 included in the light-emitting control signal lines 32 may be located in the second non-display area 102, and at least a portion of the first connection lines 23 included in the circuit control signal lines 33 may be located in the second non-display area 102.

Specifically, in the present embodiment, the display panel 100 may include the first non-display area 101 and the second non-display area 102 that are arranged adjacently. A size of the first non-display area 101 along the first direction may be different from a size of the second non-display area 102 along the first direction. Optionally, the width H1 of the first non-display area 101 along the first direction may be larger than the width H2 of the second non-display area 102 along the first direction. The shapes of the first non-display area 101 and the second non-display area 102 are not limited in the present disclosure. The two non-display areas 10 may be set to have the same shape or different shapes. Users may set the shape according to actual design requirements.

As shown in FIG. 10 and FIG. 13, in one embodiment, the shapes of the first non-display area 101 and the second non-display area 102 may be different. At this time, it may be configured that the first connection lines 23 included in the light-emitting control signal lines 32 may be all disposed in the wiring area 12 of the second non-display area 102 and the first connection lines 23 included in the circuit control signal lines 33 may be all disposed in the wiring area 12 of the second non-display area 102. Or, it may be configured that a portion of the first connection lines 23 included in the light-emitting control signal lines 32 may be disposed in the wiring area 12 of the second non-display area 102 and a portion of the first connection lines 23 included in the circuit control signal lines 33 may be disposed in the wiring area 12 of the second non-display area 102.

Correspondingly, in one embodiment, a number of the scan lines 31 including the first connection lines 23 may be 2X, a number of the light-emitting control signal lines 32 including the first connection lines 23 may be X, a number of the first circuit control signal lines 331 including the first connection lines 23 may be X/2, and a number of the second circuit control signal lines 332 including the first connection lines 23 may be X/2. Therefore, the first connection lines 23 of the X scan lines 31 and the first connection lines 23 of the X light-emitting control signal lines 32 may be disposed in the first wiring area 121 of the second non-display area 102. And, the first connection lines 23 of the X scan lines 31, the first connection lines 23 of the X/2 first circuit control lines 331, and the first connection lines 23 of the X/2 second circuit control lines 332 may be disposed in the second wiring area 122 of the second non-display area 102. That is, the first connection lines 23 included in the driving signal lines may be all located in the second non-display area 102, and the first wiring area 121 and the second wiring area 122 of the second non-display area 102 may each accommodate 2X first connection lines 23.

Figure 14:
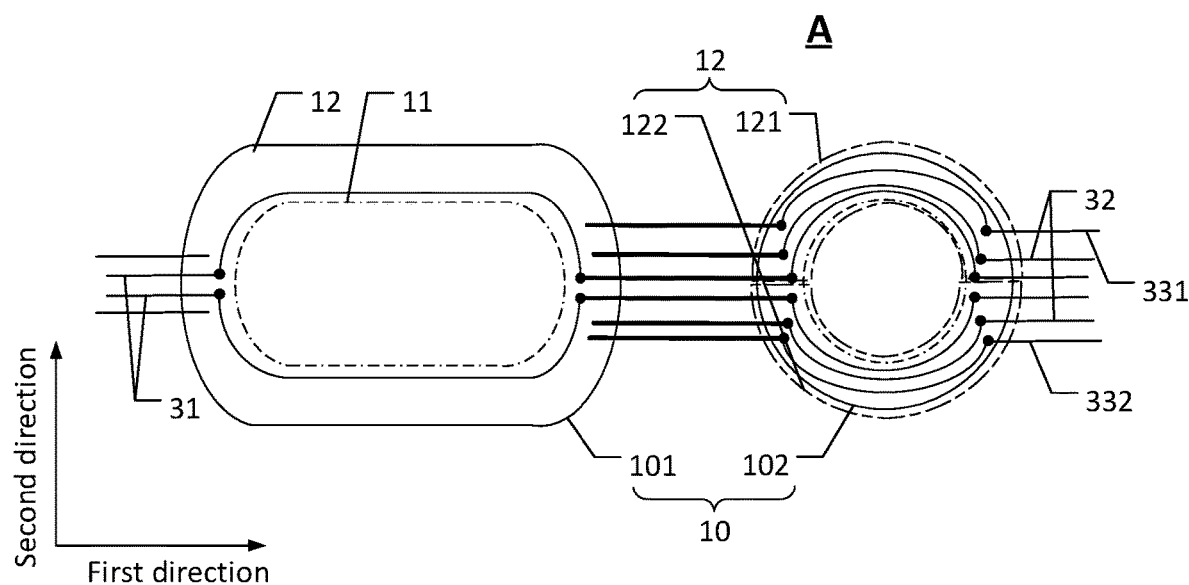
FIG. 14 illustrates another enlarged view of the region A in FIG. 1, consistent with various disclosed embodiments of the present disclosure.

FIG. 14 shows another enlarged view of the region A in FIG. 1. In another embodiment shown in FIG. 1, FIG. 13, and FIG. 14, a number of the scan lines 31 including the first connection lines 23 may be 2X, a number of the light-emitting control signal lines 32 including the first connection lines 23 may be X, a number of the first circuit control signal lines 331 including the first connection lines 23 may be X/2, and a number of the second circuit control signal lines 332 including the first connection lines 23 may be X/2. Therefore, the first connection lines 23 of the X scan lines 31, the first connection lines 23 of the X/2 light-emitting control signal lines 32, and the first connection lines 23 of the X/2 first circuit control lines 331 may be disposed in the first wiring area 121 of the second non-display area 102. And, the first connection lines 23 of the X scan lines 31, the first connection lines 23 of the X/2 light-emitting control signal lines 32, and the first connection lines 23 of the X/2 second circuit control lines 332 may be disposed in the second wiring area 122 of the second non-display area 102. That is, the first connection lines 23 included in the driving signal lines may be all located in the second non-display area 102, and the first wiring area 121 and the second wiring area 122 of the second non-display area 102 may each accommodate 2X first connection lines 23.

In another embodiment, a number of the scan lines 31 including the first connection lines 23 may be 2X, a number of the light-emitting control signal lines 32 including the first connection lines 23 may be X, a number of the first circuit control signal lines 331 including the first connection lines 23 may be X/2, and a number of the second circuit control signal lines 332 including the first connection lines 23 may be X/2. Therefore, the first connection lines 23 of the X/2 light-emitting control signal lines 32 and the first connection lines 23 of the X/2 first circuit control lines 331 may be disposed in the first wiring area 121 of the second non-display area 102. And, the first connection lines 23 of the 2X scan lines 31, the first connection lines 23 of the X/2 light-emitting control signal lines 32, and the first connection lines 23 of the X/2 second circuit control lines 332 may be disposed in the second wiring area 122 of the second non-display area 102. The first connection lines 23 of the X/2 light-emitting control signal lines 32 may be disposed in the first wiring area 121 of the first non-display area 101. The first connection lines 23 of the X/2 first circuit control lines 331 may be disposed in the second wiring area 122 of the first non-display area 101. The first connection lines 23 of the X scan lines 31 may be disposed in the first wiring area 121 of the second non-display area 102, and the first connection lines 23 of the X scan lines 31 may be disposed in the second wiring area 122 of the second non-display area 102. The first connection lines 23 of the X/2 light-emitting control signal lines 32 may be disposed in the first wiring area 121 of the second non-display area 102, and the first connection lines 23 of the X/2 second circuit control lines 332 may be disposed in the second wiring area 122 of the second non-display area 102. That is, the first connection lines 23 included in the driving signal lines may be disposed in the first non-display area 101 and in the second non-display area 102. The first non-display area 101 may accommodate X first connection lines 23, and the second non-display area 102 may include 3X first connection lines 23.

In another embodiment, a number of the scan lines 31 including the first connection lines 23 may be 2X, a number of the light-emitting control signal lines 32 including the first connection lines 23 may be X, a number of the first circuit control signal lines 331 including the first connection lines 23 may be X/2, and a number of the second circuit control signal lines 332 including the first connection lines 23 may be X/2. Therefore, the first connection lines 23 of the X/2 scan lines 31, the first connection lines 23 of the X/2 light-emitting control signal lines 32, and the first connection lines 23 of the X/2 first circuit control lines 331 may be disposed in the first wiring area 121 of the second non-display area 102. And, the first connection lines 23 of the X/2 scan lines 31, the first connection lines 23 of the X/2 light-emitting control signal lines 32, and the first connection lines 23 of the X/2 second circuit control lines 332 may be disposed in the second wiring area 122 of the second non-display area 102. The first connection lines 23 of the remaining X scan lines 31 may be disposed in the wiring area 12 of the first non-display area 101. Specifically, the first wiring area 121 of the first non-display area 101 may accommodate the first connection lines of the X/2 scan lines 31, and the second wiring area 122 of the first non-display area 101 may accommodate the first connection lines of the X/2 scan lines 31. That is, the first connection lines 23 included in the driving signal lines may be disposed in the first non-display area 101 and in the second non-display area 102. The first non-display area 101 may accommodate X first connection lines 23, and the second non-display area 102 may include 3X first connection lines 23.

In another embodiment, a number of the scan lines 31 including the first connection lines 23 may be 2X, a number of the light-emitting control signal lines 32 including the first connection lines 23 may be X, a number of the first circuit control signal lines 331 including the first connection lines 23 may be X/2, and a number of the second circuit control signal lines 332 including the first connection lines 23 may be X/2. The X scan lines 31 including the first connection lines 23 may be driven at both sides. That is, the first connection lines included in X scan lines may include first sub-first-connection lines 23 in the first non-display area 101 and second sub-first-connection lines 23 in the second non-display area 102. In one of the X scan lines 31, the first end of the second segment 22 may be electrically connected to the corresponding first segment 21 (the first sub-first-segment 211) at a side of the first non-display area 101 away from the second segment 22 through the corresponding first sub-first-connection line 23; and the second end of the second segment 22 may be electrically connected to the corresponding first segment 21 (the second sub-first-segment 212) at the side of the first non-display area 101 away from the second segment 22 through the corresponding first sub-first-connection line 23. The X light-emitting control signal lines 32 including the first connection lines 23 may be driven at both sides, and the X circuit control signal lines 33 including the first connection lines 23 may be driven at both sides. The first wiring areas 121 of the first non-display area 101 and the second non-display area 102 may include (X/2) scan lines 31 including the first connection lines 23, and (X/2) light-emitting control signal lines 32 including the first connection line 23, and (X/2) first circuit control lines 331 including the first connection line 23. The second wiring areas 122 of the first non-display area 101 and the second non-display area 102 may include the remaining (X/2) scan lines 31 including the first connection lines 23, (X/2) light-emitting control signal lines 32 including the first connection lines 23, and (X/2) scan lines 31 including the first connection lines 23. The remaining X scan lines 31 including the first connection line 23 may be averagely arranged in the first wiring area 121 and the second wiring area 122 of the second non-display area 102. This part of the scan lines 31 including the first connection lines 23 may be driven by one side.

The embodiments where the number of the scan lines 31 including the first connection lines 23 may be 2X, the number of the light-emitting control signal lines 32 including the first connection lines 23 may be X, and the number of the circuit control signal lines 33 including the first connection lines 23 may be X, are used as examples to illustrate the present disclosure, and do not limit the scope of the present disclosure. In some other embodiments, all the driving signal lines including the first connection line 23 may be bilaterally driven, or an arbitrary number of driving signal lines including the first connection line 23 may be set to be unilaterally driven. In unilateral driving, a connecting line 23 included in each driving signal line may be arranged in the wiring area 12 of the first non-display area 101 or may be arranged in the wiring area 12 of the second non-display area 102. The numbers of the first connection lines disposed in the first wiring area 121 and the second wiring area 122 in each of the non-display areas 10 is not specifically limited in the present disclosure, and the user may make corresponding adjustments according to actual setting requirements.

Figure 15:
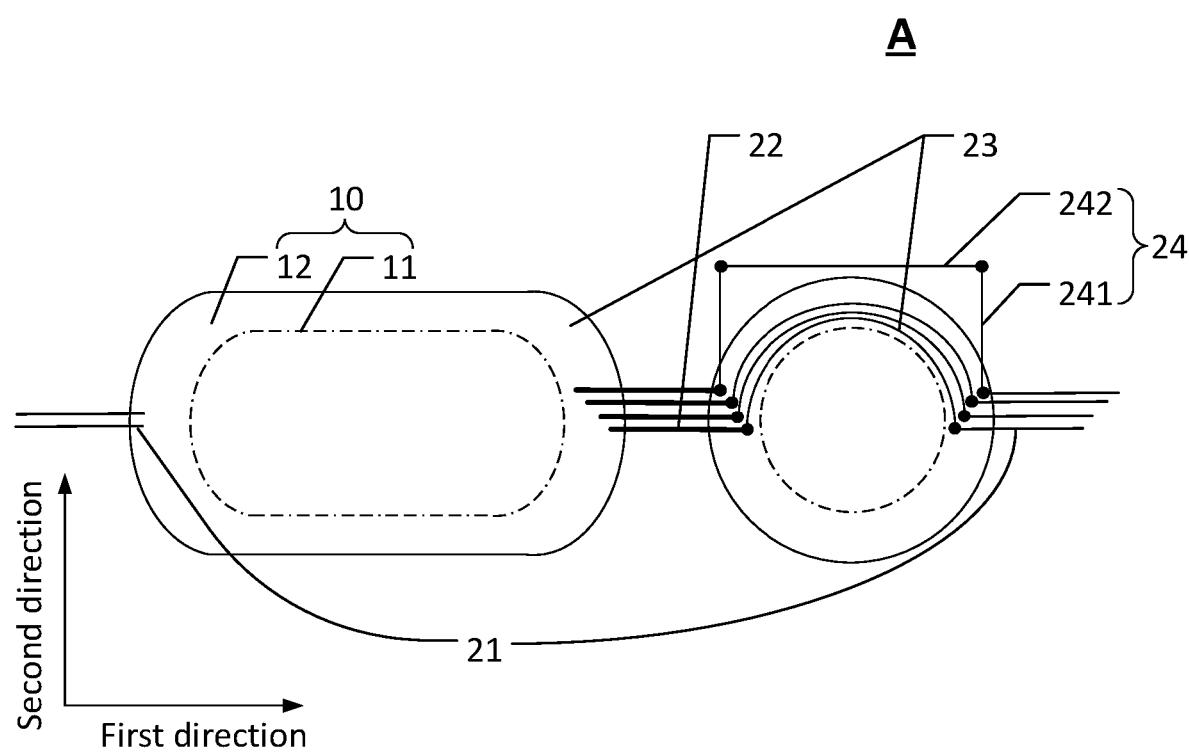
FIG. 15 illustrates another enlarged view of the region A in FIG. 1, consistent with various disclosed embodiments of the present disclosure.
Figure 16:
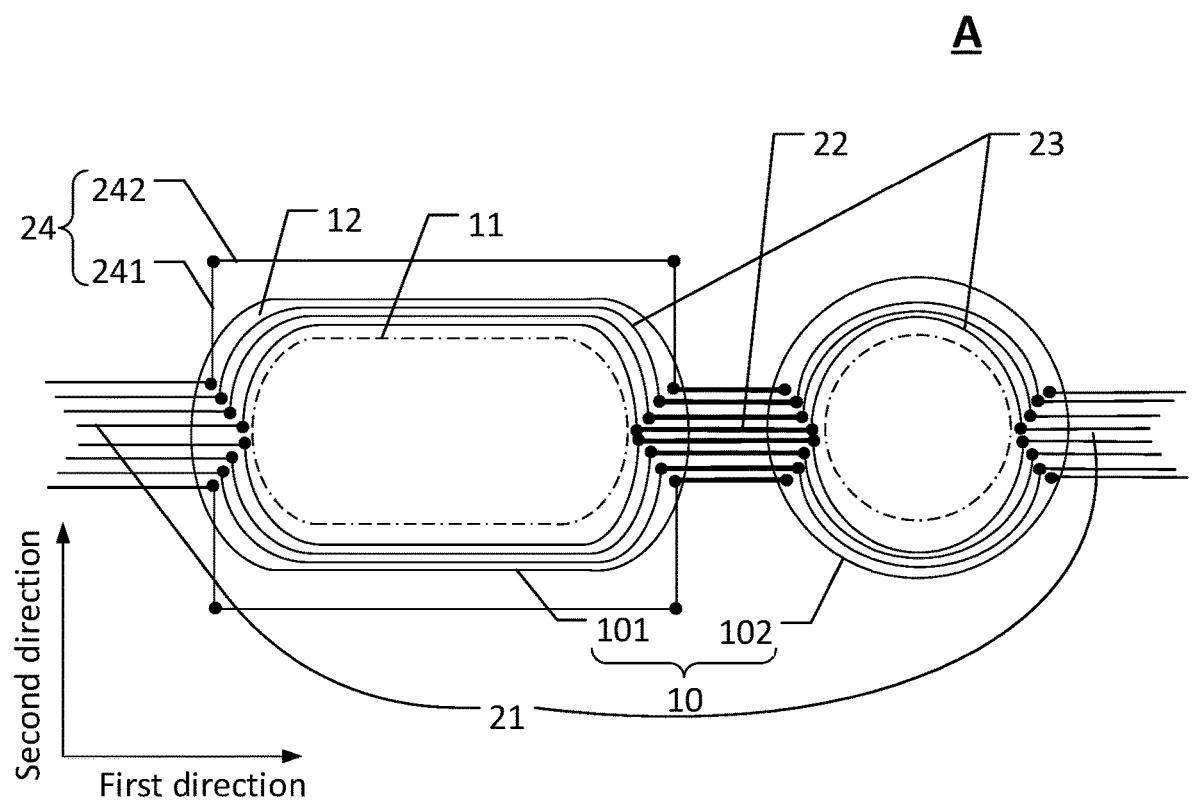
FIG. 16 illustrates another enlarged view of the region A in FIG. 1, consistent with various disclosed embodiments of the present disclosure.
Figure 17:
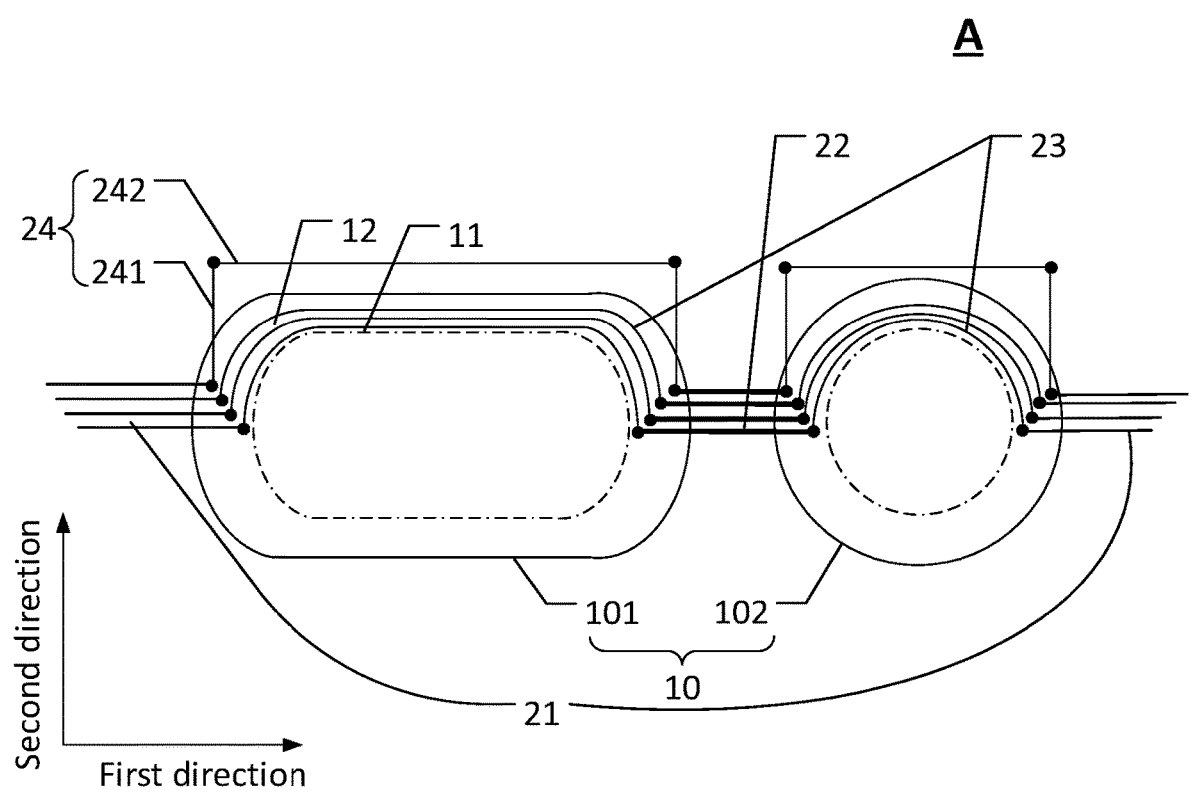
FIG. 17 illustrates another enlarged view of the region A in FIG. 1, consistent with various disclosed embodiments of the present disclosure.

FIG. 15 shows another enlarged view of the region A in FIG. 1, FIG. 16 shows another enlarged view of the region A in FIG. 1, and FIG. 17 shows another enlarged view of the region A in FIG. 1. In one embodiment shown in FIG. 1 and FIGS. 15-17, the driving signal lines 24 may include second connection lines 24. One first segment 21 may be connected to one corresponding second segment 22 through one corresponding second connection line 24.

One second connection line 24 may include two first connection wires 241 and one second connection wire 242. The first connection wires 241 may extend along a second direction, and the second connection wire 242 may extend along the first direction. The second direction may intersect with the first direction.

Along the second direction, the second connection wire 242 may be located at a side of the wiring area 12 away from the light-transmitting area 11, and the two ends of the second connection wire 242 may be electrically connected to the two first connection wires 241 respectively.

Along the first direction, another end of one first connection wire 241 may be electrically connected to the second segment 22, and another end of another first connection wire 241 may be electrically connected to the first segment 21

In one embodiment of the present disclosure, some of the driving signal lines may include the second connection lines 24, and two ends of one second connection line 24 may be electrically connected to the first segment 21 and the second segment 22 respectively. That is, the second connection lines 24 may be used instead of the first connection lines 23 in the aforementioned solution.

One second connection line 24 may include three small segments including two first connection wires 241 and one second connection wire 242. The first connection wires 241 may extend along the second direction, and the second connection wire 242 may extend along the first direction. Along the second direction, the second connection wire 242 may be located at one side of the wiring area 12 away from the light-transmitting area 11, and the two ends of the second connection wire 242 may be electrically connected to the two first connection wires 241 respectively. Therefore, the second connection lines 24 may be used instead of the first connection lines 23 in the aforementioned solution. The first connection lines 23 may be located in the wiring area 12 in the non-display areas 10, while the second connection wires 242 of the second connection lines 24 may be located at one side of the wiring area 12 away from the light-transmitting area 11. Therefore, the second connection wires 242 of the second connection lines 24 may have no overlapping area with the non-display regions 10.

The user's demand for the screen ratio of the display panel 100 is getting higher and higher. To increase the screen ratio of the display panel 100, there is a situation where the area of the wiring areas 12 of the non-display areas 10 needs to be compressed. When the wiring areas 12 of the non-display areas 10 are not enough to accommodate all the driving signal lines that need to include the first connection lines 23, the first connection lines 23 required by some of the driving signal lines may be replaced by the second connection lines 24. Therefore, the electrical connection requirements between the second segments 22 and the first segments 21 may be realized, and also the area of the wiring areas 12 of the non-display area 10 in the display panel 100 may be reduced, to increase the screen ratio of the display panel 100 and ensure the normal display of the display area 01 between the non-display areas 10 at the same time.

FIG. 15 shows an embodiment in which the second connection lines 24 are used in the circular non-display area 10, and FIG. 16 shows an embodiment in which the second connection lines 24 are used in the first non-display area 101, FIG. 17 shows an embodiment in which the second connection lines 24 are used for both the first non-display area 101 and the second non-display area 102. These three embodiments are used as examples to illustrate the present disclosure, and do not limit the scope of the present disclosure. It should also be noted that the second connection lines 24 shown in FIG. 15 and FIG. 17 are located on the upper side of the non-display area 10, which is used as example to illustrate the present disclosure. In some other embodiments, when the panel space allows, the second connection lines 24 may also be set at the lower side of the non-display area 10. In some other embodiments, as shown in FIG. 16, the second connection lines 24 may be disposed at both the upper and lower sides of the non-display area 10. The present disclosure has no specific limit on this.

As shown in FIG. 15 to FIG. 17 in adjunction with FIG. 1 to FIG. 14, in one embodiment, one pixel circuit 70 may include a data writing module 61, and one driving signal line may include a scan line 31 electrically connected to one corresponding data writing module 61.

The driving signal line including the second connection lines 24 may be the scan lines 31.

In the present embodiment, among the driving signal lines which are required to be electrically connected to the first connection lines 23 or the second connection lines 24, there may be a type of drive signal lines that are the scan lines 31, and the scan lines 31 may be used to electrically connect the data writing modules 61 in the pixel circuits 70. Therefore, the relationship between the scan lines 31 and the pixel circuits 70 may usually be that one scan line 31 is electrically connected to one row of the pixel circuits 70. In the wiring design of the display panel 100, the number of the driving signal lines of the type of the scan lines 31 may be relatively large, and there may be too many scan lines 31 that need to be electrically connected by the first connection lines 23 or the second connection lines 24. The area of the wiring areas 12 may be not enough to set up a wiring arrangement scheme in which all the scan lines 31 are connected through the first connection line 23. Therefore, a portion of the scan lines 31 may be set to include the first connection line 23, and a remaining portion of the scan lines 31 may be set to include the second connection lines 24.

Therefore, it may not only meet the required number of the scan lines 31 including the first connection lines 23 or the second connection lines 24, but also increase the screen ratio of the display panel 100. Further, the normal display of the display area 01 between the non-display areas 10 may be ensured.

Figure 18:
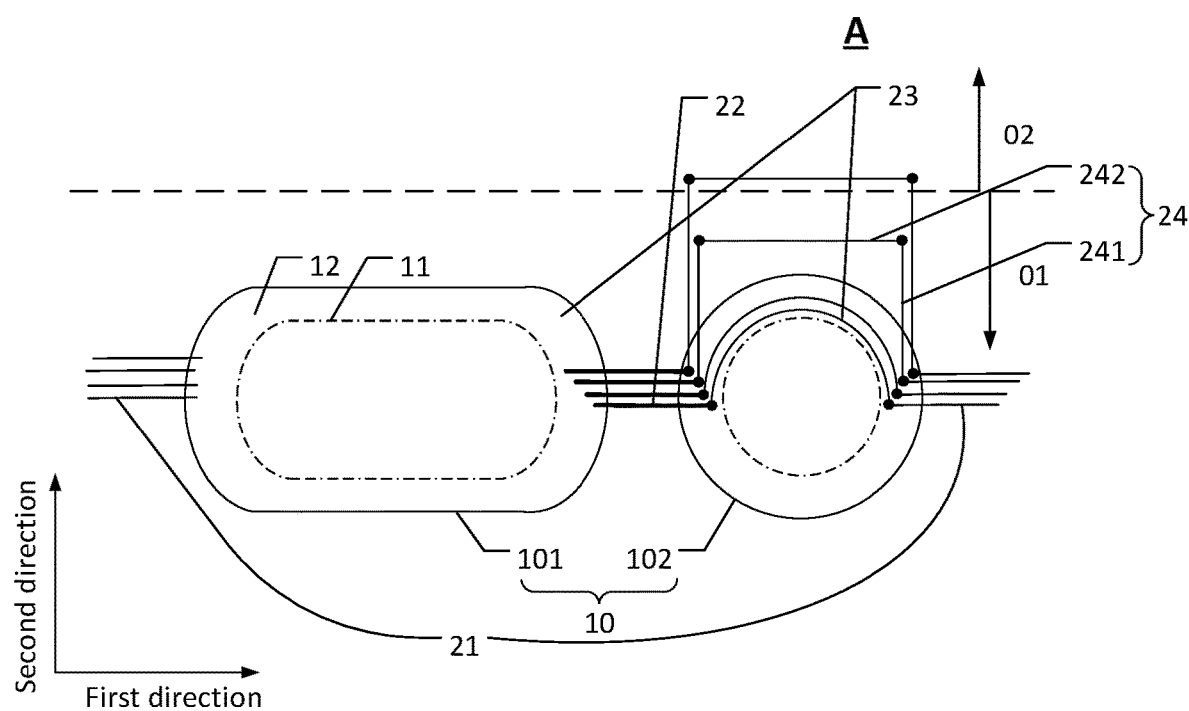
FIG. 18 illustrates another enlarged view of the region A in FIG. 1, consistent with various disclosed embodiments of the present disclosure.
Figure 19:
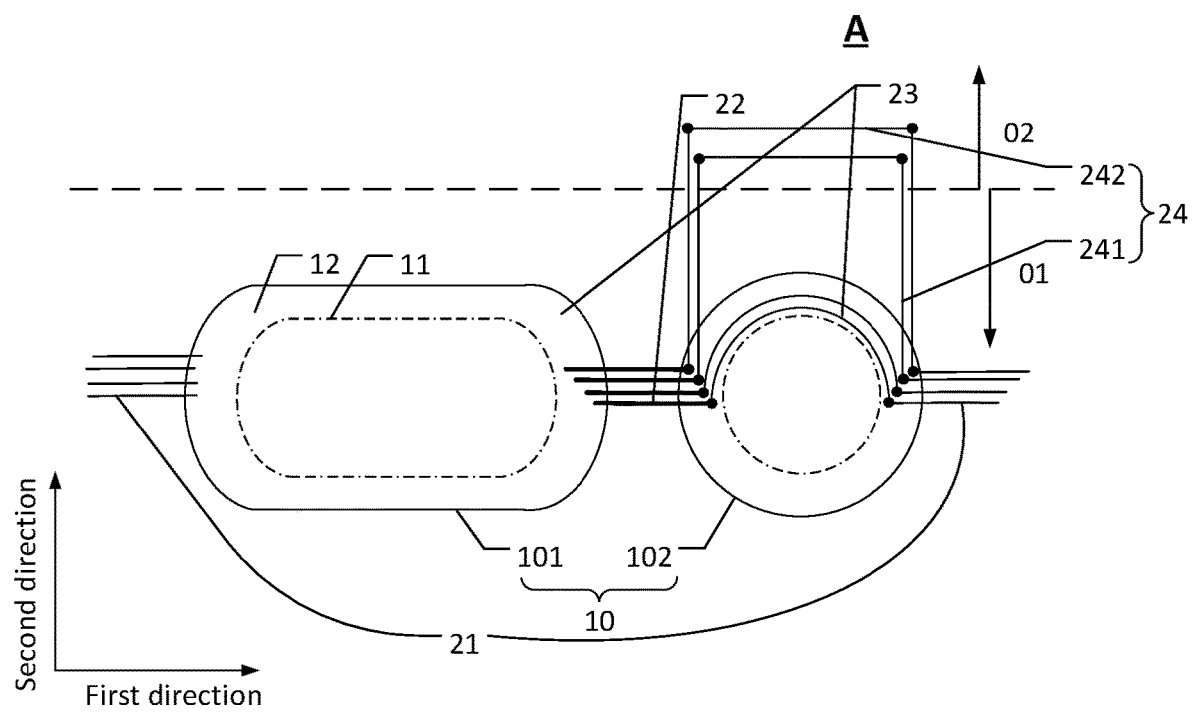
FIG. 19 illustrates another enlarged view of the region A in FIG. 1, consistent with various disclosed embodiments of the present disclosure.

FIG. 18 shows another enlarged view of the region A in FIG. 1, and FIG. 19 shows another enlarged view of the region A in FIG. 1. As shown in FIG. 18 and FIG. 19 in adjunction with FIG. 1 to FIG. 14, in one embodiment, the second connection wires 242 may be at least partially located in the display area 01. In one embodiment, the display panel 100 may further include a frame area 02, and the frame area 02 may at least partially surround the display area 01. The second connection wires 42 may be located at least partly in the frame area 02.

To reduce the area of the wiring areas 12 of the non-display areas 10 in the display panel 100 and increase the screen ratio of the display panel 100, the second connection lines 24 provided in the present embodiment that can be used to replace the first connection lines 23 may be located at the side of the wiring areas 12 of the non-display areas 10 away from the light-transmitting area 11. Therefore, in one embodiment, all the second connection wires 242 included in the second connection lines 24 may be located in the display area. 01, which may not only satisfy the required number of the scan lines 31 including the first connection lines 23 or the second connection lines 24 but also avoid the occupation of the peripheral frame area 02 of the display area 01. The screen ratio of the display panel 100 may be improved.

When the space in the display area 01 is not enough to set the required number of second connection wires 242 and there is enough space in the frame area 02, in one embodiment, as shown FIG. 18, a portion of the second connection wires 242 included in the second connection lines 24 may be arranged in the display area 01, and a remaining portion of the second connection wires 242 included in the second connection lines 24 may be arranged in the frame area 02, which may not only meet the required configuration of the scan lines 31 including the first connection lines 23 or the second connection lines 24 and also ensure the normal display function of the display panel 100.

When the space in the display area 01 is not enough to set the required number of second connection wires 242 and there is enough space in the frame area 02, in one embodiment, as shown FIG. 19, all the second connection wires 242 included in the second connection lines 24 may be arranged in the frame area 02, which may not only meet the required configuration of the scan lines 31 including the first connection lines 23 or the second connection lines 24 and also ensure the normal display function of the display panel 100.

When the second connection wires 242 of the second connection lines 24 are arranged in the display area 01, along the second direction, the second connection wires 242 may be arranged at a side of the first wiring area 121 away from the light-transmitting area 11 along the second direction, or may be arranged at a side of the second wiring area 122 away from the light-transmitting area 11, or may be arranged at the side of the first wiring area 121 away from the light-transmitting area 11 and the second wiring area 122 away from the light-transmitting area 11 at the same time, which is not specifically limited in the present disclosure.

Similarly, when the second connection wires 242 of the second connection lines 24 are arranged in the frame area 02, along the second direction, the second connection wires 242 may be arranged in the frame area 02 at a side of the first wiring area 121 away from the light-transmitting area 11 along the second direction, or may be arranged in the frame area 02 at a side of the second wiring area 122 away from the light-transmitting area 11, or may be arranged in the frame area 02 at the side of the first wiring area 121 away from the light-transmitting area 11 and the second wiring area 122 away from the light-transmitting area 11 at the same time, which is not specifically limited in the present disclosure.

When the display panel 100 includes the first non-display area 101 and the second non-display area 102 arranged adjacently, the size of the first non-display area 101 along the first direction may be different from the size of the second non-display area 102 along the first direction. For example, the width H1 of the first non-display area 101 may be larger than the width H2 of the second non-display area 102, the configuration of the second connection lines 24 may include: the second connection lines 24 are used to electrically connect the second segments 22 and the first segments 21 located at the side of the first non-display area 101 away from the second non-display area 102, or the second connection lines 24 are used to electrically connect the second segments 22 and the first segments located at the side of the second non-display area 102 away from the first non-display area 101, or the second connection lines 24 are arranged at two sides of the first non-display area 101 and at two sides of the second non-display area 102. The above-mentioned three manners of setting the second connection lines 24 are the three embodiments provided by the present disclosure, and the user may select them according to requirements.

Although the second connection lines 24 exemplified in the above-mentioned embodiments are used to realize the normal connection of the scan lines 31, in the application of the display panel 100 including the non-display areas 10, as long as the wiring in the non-display areas 10 is required for the driving signal lines in the wiring areas 12 that are electrically connected, the second connection lines 24 may be used to replace part of the first connection lines 23 when necessary. That is, the arrangement that replacing part of the first connection lines 23 of the scan lines 31 with the second connection lines 24 provided by the above embodiments are used as examples to provide some wiring arrangement ideas, and do not limit the types of the second connection lines 24 used for the scan line 31.

In one embodiment, the number of the scan lines 31 required to include the first connection lines 23 may be 2X, the number of the light-emitting control signal lines 32 required to include the first connection lines 23 may be X, and the number of the circuit control signal lines 33 required to include the first connection lines 23 may be X. Therefore, X scan lines 31 including the first connection lines 23 and X light-emitting control signal 32 including the first connection lines 23, and X circuit control signal lines 33 including the first connection lines 23 may be disposed in the first wiring area 121 and the second wiring area 122 at two sides of the light-transmitting area 11. For the remaining X scan lines 31 required to include the first connection lines 23, the first connection lines 23 may be replaced with the second connection lines 24. That is, X scan lines 31 including the second connection lines 24 may be disposed in the display area 01 and/or the frame area 02 at the side of the wiring areas 12 away from the light-transmitting area 11. Correspondingly, the number of wires in the wiring areas 12 may be reduced, and the area of the wiring areas 12 may be reduced to a certain extent, therefore increasing the screen ratio of the display panel 100. At the same time, in the display area 01 between the two adjacent non-display areas 10, the electrical signals required for the normal operation of the pixel circuits 70 may be ensured, and the display function of normal production in this area may be guaranteed.

Figure 20:
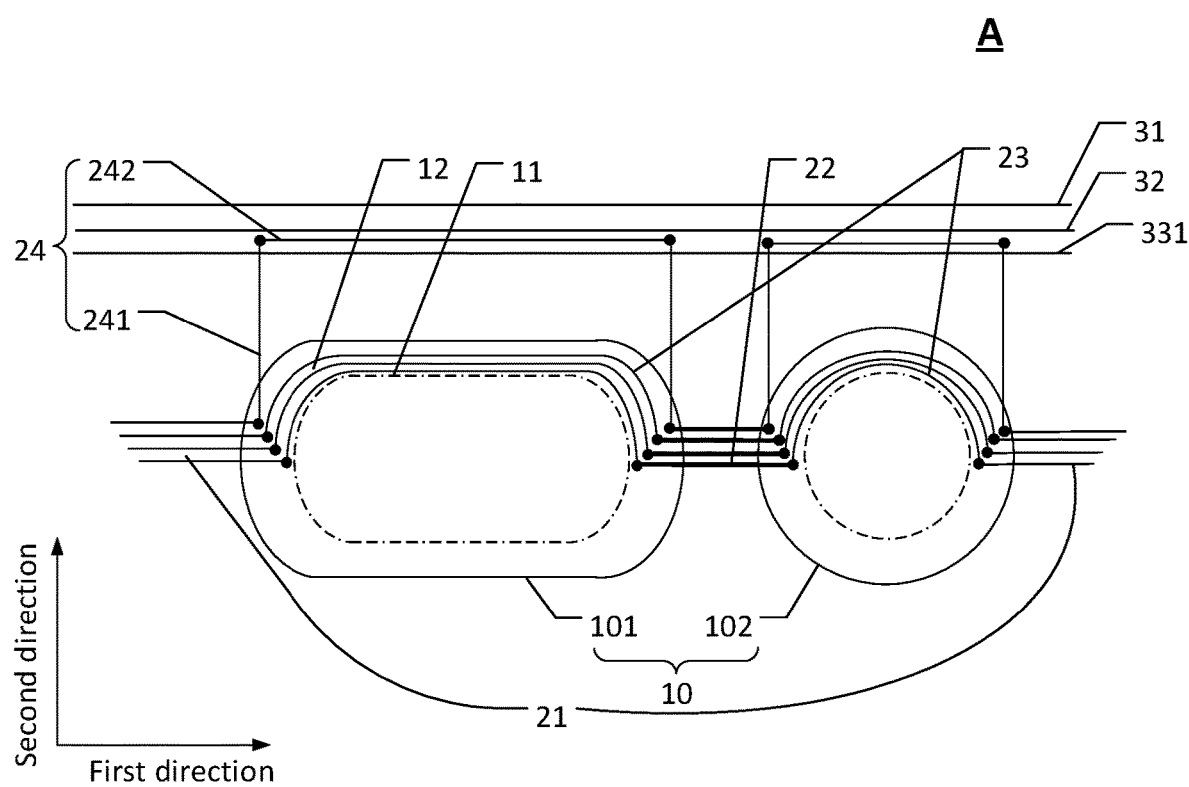
FIG. 20 illustrates another enlarged view of the region A in FIG. 1, consistent with various disclosed embodiments of the present disclosure.
Figure 21:
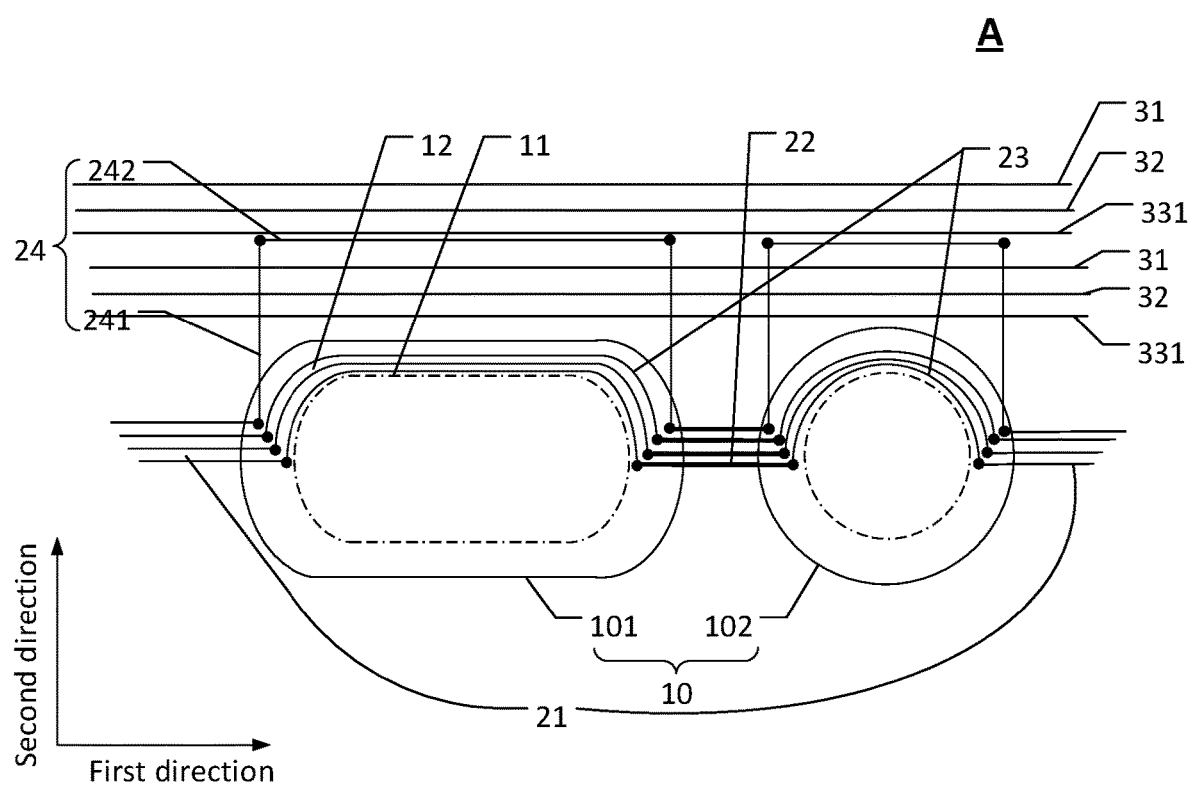
FIG. 21 illustrates another enlarged view of the region A in FIG. 1, consistent with various disclosed embodiments of the present disclosure.
Figure 22:
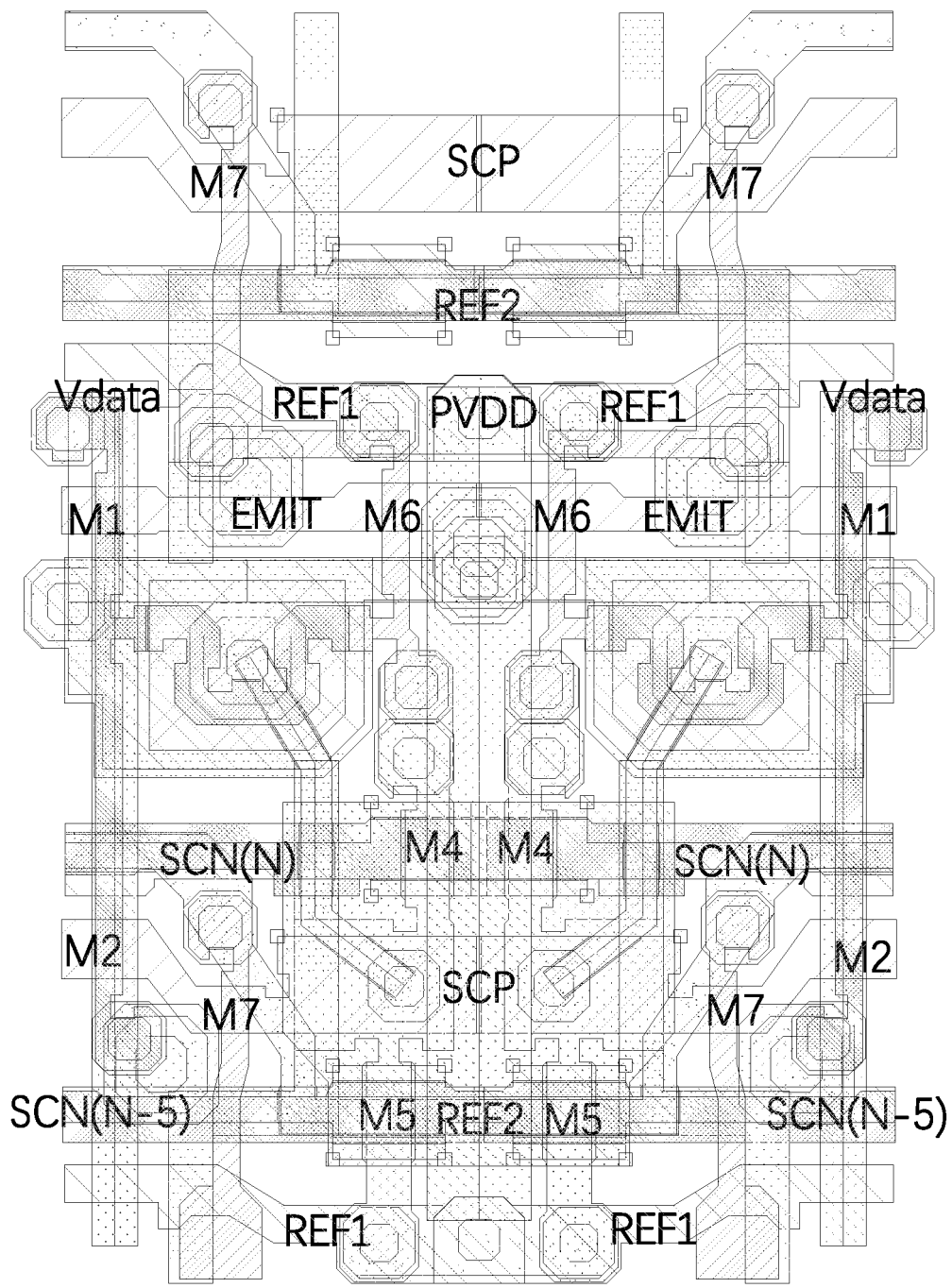
FIG. 22 illustrates a layout diagram of the region A in FIG. 1, consistent with various disclosed embodiments of the present disclosure.

FIG. 20 shows another enlarged view of the region A in FIG. 1, FIG. 21 shows another enlarged view of the region A in FIG. 1, and FIG. 22 shows an exemplary layout of the region A in FIG. 1 with configuration of the second connection wires 242. As shown in FIG. 20 to FIG. 22, and FIG. 19 in adjunction with FIG. 1 to FIG. 14, in one embodiment, one pixel circuit 70 may include a data writing module 61, a light-emitting control module 62, and a reset module 63. The driving signal line includes scan lines 31 electrically connected to data writing modules 61, light-emitting control signal lines electrically connected to light-emitting control modules 62, and first circuit control lines 331 electrically connected to reset modules 63.

Along the second direction, electrically connected to one same pixel circuit 70, the light-emitting control signal line 32 may be located between the scan line 31 and the first circuit control line 331. The second direction may intersect with the first direction.

Along the second direction, one second connection wire 242 may be located between the corresponding lighting control signal line 32 and the corresponding first circuit control line 331.

Each pixel circuit 70 included in the display panel 100 may include, in addition to the data writing module 61, at least one light-emitting control module 62, one reset module 63 and one compensation module 64. The driving signal lines electrically connected to the data writing modules 61 may be the scan lines 31, the driving signal line electrically connected to the light-emitting control modules 62 may be the light-emitting control signal line 32, the driving signal line electrically connected with the reset modules 63 may be the first circuit control lines 331, and the driving signal lines electrically connected to the compensation modules 64 may be the second circuit control lines 332. That is, in one embodiment, the types of the driving signal lines may at least include three types of lines: the scan lines 31, the light-emitting control signal lines 32 and the circuit control signal lines 33. It should be added that the present disclosure is not limited to this, and the types of the driving signal lines may be adjusted according to the specific design of the display panel 100, which is not specifically limited in the present disclosure.

Correspondingly, in one embodiment, an arrangement of the second connection wires 242 included in the second connection lines 24 in the display area 01 may include: along the second direction, one second connection wire 242 is located between one corresponding light-emitting control signal line 31 and one corresponding first circuit control line 331 electrically connected to the same pixel circuit 70. The light-emitting control signal line 32 may be located between the scan line 31 and the first circuit control line 331 electrically connected to the same pixel circuit 70 in the second direction. To avoid the overlapping area between the second connection wires 242 and other lines in the thickness direction of the display panel 100 and avoid the interference of the second connection wires 242 on other electrical signals, the second connection wires 242 may be not arranged between the scan lines 31 and the light-emitting control signal lines 32 since there is no space for the second connection wires 242 in this area. There may be a small space enough for at least one line between the light-emitting control signal line 32 and the first circuit control line 331 electrically connected to one same pixel circuit 70. Therefore, in the present embodiment, at least one second connection wire 242 may be arranged between the lighting control signal line 32 and the first circuit control line 331. The setting of the second connection wires 242 may be realized, and the normal use of other signal lines in the display panel 100 may be not affected.

When there is space in the display area 01 to arrange several second connection wires 242, the normal transmission of the electrical signals required by the pixel circuits 70 between the two adjacent non-display areas 10 may be realized, and the number of wirings in the wiring areas 12 in the non-display areas 10 may be reduced, to increase the screen ratio of the display panel 100.

As shown in FIG. 20 to FIG. 22, and FIG. 19 in adjunction with FIG. 1 to FIG. 14, in one embodiment, one pixel circuit 70 may include a data writing module 61, a light-emitting control module 62, and a reset module 63. The driving signal line includes scan lines 31 electrically connected to data writing modules 61, light-emitting control signal lines electrically connected to light-emitting control modules 62, and first circuit control lines 331 electrically connected to reset modules 63.

Along the second direction, electrically connected to one same pixel circuit 70, the light-emitting control signal line 32 may be located between the scan line 31 and the first circuit control line 331. The second direction may intersect with the first direction.

Along the second direction, one second connection wire 242 may be located between one first circuit control line 331 in the previous-row pixel circuits 70 and one scan line 31 in the next-row pixel circuits 70 arranged adjacently.

Each pixel circuit 70 included in the display panel 100 may include, in addition to the data writing module 61, at least one light-emitting control module 62, one reset module 63 and one compensation module 64. The driving signal lines electrically connected to the data writing modules 61 may be the scan lines 31, the driving signal line electrically connected to the light-emitting control modules 62 may be the light-emitting control signal line 32, the driving signal line electrically connected with the reset modules 63 may be the first circuit control lines 331, and the driving signal lines electrically connected to the compensation modules 64 may be the second circuit control lines 332. That is, in one embodiment, the types of the driving signal lines may at least include three types of lines: the scan lines 31, the light-emitting control signal lines 32 and the circuit control signal lines 33. It should be added that the present disclosure is not limited to this, and the types of the driving signal lines may be adjusted according to the specific design of the display panel 100, which is not specifically limited in the present disclosure.

Correspondingly, in one embodiment, an arrangement of the second connection wires 242 included in the second connection lines 24 in the display area 01 may include: along the second direction, one second connection wire 242 may be located between one first circuit control line 331 in the previous-row pixel circuits 70 and one scan line 31 in the next-row pixel circuits 70 arranged adjacently. The light-emitting control signal line 32 may be located between the scan line 31 and the first circuit control line 331 electrically connected to the same pixel circuit 70 in the second direction. To avoid the overlapping area between the second connection wires 242 and other lines in the thickness direction of the display panel 100 and avoid the interference of the second connection wires 242 on other electrical signals, the second connection wires 242 may be not arranged between the scan lines 31 and the light-emitting control signal lines 32 since there is no space for the second connection wires 242 in this area. There may be a small space enough for at least one line between one first circuit control line 331 and one scan line electrically connected to pixel circuits 70 of adjacent rows along the first direction. Therefore, in the present embodiment, at least one second connection wire 242 may be disposed between one first circuit control line 331 in the previous-row pixel circuits 70 and one scan line 31 in the next-row pixel circuits 70 arranged adjacently. The setting of the second connection wires 242 may be realized, and the normal use of other signal lines in the display panel 100 may be not affected.

When there is space in the display area 01 to arrange several second connection wires 242, the normal transmission of the electrical signals required by the pixel circuits 70 between the two adjacent non-display areas 10 may be realized, and the number of wirings in the wiring areas 12 in the non-display areas 10 may be reduced, to increase the screen ratio of the display panel 100.

The above two embodiments where the second connection wires 242 are set in the above two positions in the display area 01, are used as examples to illustrate the present disclosure, and do not limit the scope of the present disclosure. In some other embodiments, the second connection wires may be arranged between the light-emitting control signal lines 32 and the first circuit control lines 331 electrically connected to the same pixel circuits 70, and the second connection wires 242 may be also arranged between the first circuit control line s331 in the previous-row pixel circuits 70 and the scan lines 31 in the next-row pixel circuits 70 arranged adjacently. The present disclosure has no limit on this, and the setting position of the second connection wires 242 may be adjusted according to the actual design of the panel, to ensure the normal display of the display area 01 in the display panel 100.

Figure 23:
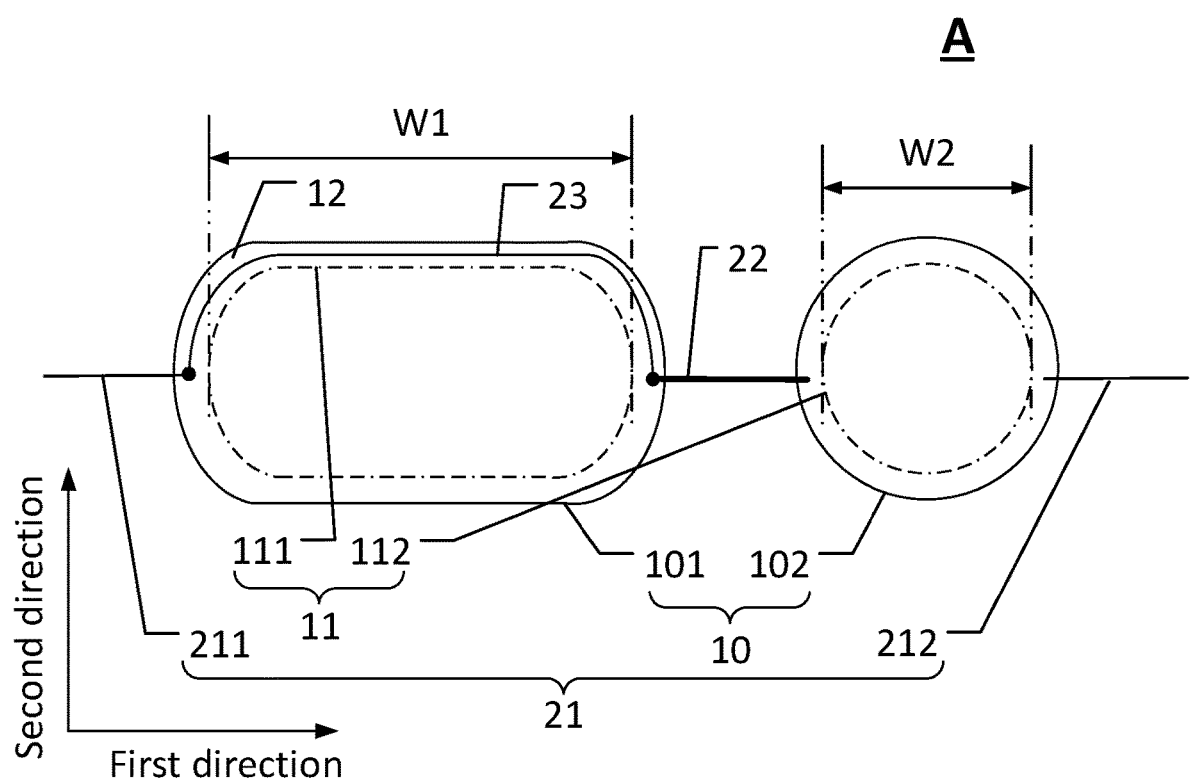
FIG. 23 illustrates another enlarged view of the region A in FIG. 1, consistent with various disclosed embodiments of the present disclosure.

FIG. 23 shows another enlarged view of the region A in FIG. 1. As shown in FIG. 23 in adjunction with FIG. 1 to FIG. 31, in one embodiment, along the first direction, the light-transmitting area 11 may include at least one first light-transmitting area 111 and at least one second light-transmitting area 112.

Along the first direction, a width of the at least one first light-transmitting area 111 may be W1, and a width of the at least one second light-transmitting area 112 may be W2. W1>W2.

In the present embodiment, along the first direction, the display panel may include a first non-display area 101 and a second non-display area 102 arranged adjacently. The light-transmitting area 11 in the first non-display area 101 may be specifically the first light-transmitting area 111, and the light-transmitting area 11 in the second non-display area 102 may be specifically the second light-transmitting region 112. The width W1 of the first light-transmitting region 111 along the first direction may be larger than the width W2 of the second light-transmitting region 112. In one embodiment shown in FIG. 23, the orthographic projection of the first light-transmitting area 111 on the plane where the display panel 100 is located may be a racetrack shape, and the orthographic projection of the second light-transmitting area 112 on the plane where the display panel 100 is located may be a circle shape.

The above embodiment where the display panel 100 only includes the first light-transmitting area 111 with the width W1 and the second light-transmitting area 112 with the width W2 is used as an example only to illustrate the present disclosure, and does not limit the scopes of the present disclosure. Also, the embodiment where the first light-transmitting area 111 is a racetrack shape and the second light-transmitting area 112 is a circular shape is used as an example only to illustrate the present disclosure, and does not limit the scopes of the present disclosure.

Figure 24:
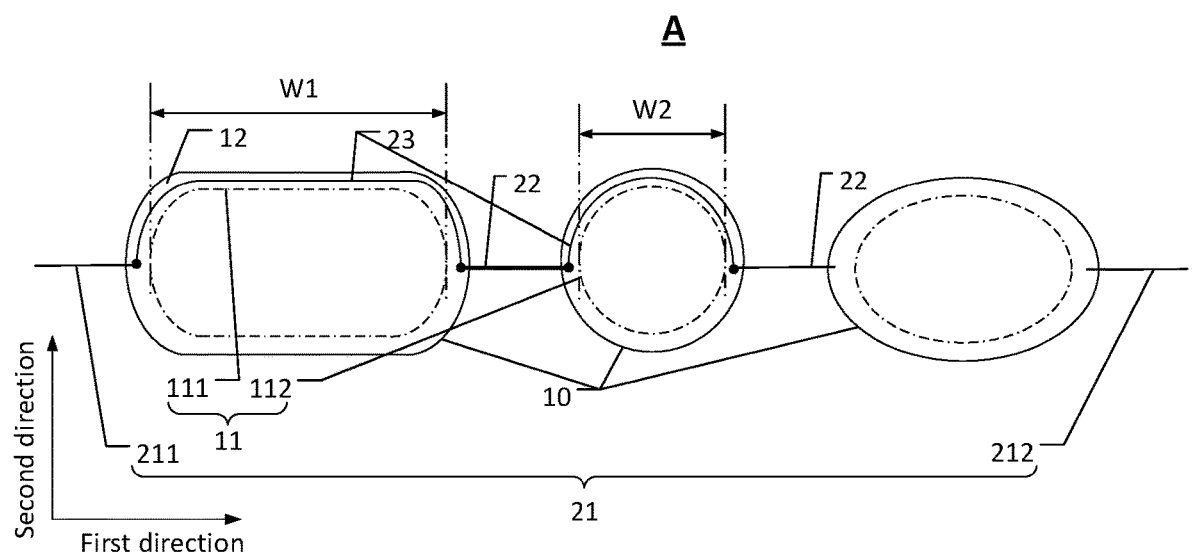
FIG. 24 illustrates another enlarged view of the region A including three non-display regions in FIG. 1, consistent with various disclosed embodiments of the present disclosure.

FIG. 24 shows another enlarged view of the region A including three non-display areas in FIG. 1. As shown in FIG. 24 in adjunction with FIG. 1 to FIG. 23, in one embodiment shown in FIG. 24, the display panel 100 may include three non-display areas 10 along the first direction, and each non-display area 10 may include a light-transmitting area 11. The areas of the light-transmitting areas 11 may be the same or different, and the shapes of the light-transmitting areas 11 may be the same or different. That is, the number, shapes, and areas of the non-display areas 10 included in the display panel 100 may be adjusted accordingly according to requirements. The first segments 21, the second segments 22, the first connection lines 23, and/or the second connection lines 24 may be used to realize the normal transmission of electrical signals in the display area 01 between the non-display areas 10 to ensure the normal display of the display area 01 between adjacent non-display areas 10.

As shown in FIG. 1 to FIG. 23, in one embodiment, the width of the wiring area 12 surrounding the first light-transmitting area 111 may be D1, and the width of the wiring area 12 surrounding the second light-transmitting area 112 may be D2, where D1<D2.

The display panel 100 may include only the first light-transmitting area 111 with a width of W1 and the second light-transmitting area 112 with a width of W2. Correspondingly, a configuration method of the related wiring areas 12 may include: as shown in FIG. 9, the width of the wiring area 12 corresponding to the first light-transmitting area 111 is D1, the width of the wiring area 12 corresponding to the second light-transmitting area 112 is D2, and the width D1 of the first light-transmitting area 111 may be configured to be smaller than the width D2 of the wiring area 12 corresponding to the second transparent area 112.

For example, the width of the wiring area 12 corresponding to the racetrack-shaped first light-transmitting area light-transmitting 111 may be set to be smaller, while the width of the wiring area 12 corresponding to the circular second light-transmitting area 112 may be larger. Therefore, the number of the first connection lines 23 provided in the wiring area 12 corresponding to the circular second light-transmitting area 112 may be set to be larger.

The above embodiment where the width D1 of the wiring area 12 corresponding to the first light-transmitting area 111 is smaller than the width D2 of the wiring area 12 corresponding to the second light-transmitting area 112 is used as an example to illustrate the present disclosure, and does not limit the scope of the present disclosure. In some other embodiments, the width D1 of the wiring area 12 of the first transparent area 111 may also be set to be equal to or greater than the width D2 of the wiring area 12 corresponding to the second transparent area 112.

The first connection lines 23 included in the driving signal lines may be disposed in the wiring areas 12 of the non-display areas 10, and may be disposed in at least one wiring area 12 corresponding to the non-display areas 10. Therefore, for example, when the display panel 100 includes the first non-display area 101 and the second non-display area 102, and the width of the wiring area 12 corresponding to the first non-display area 101 is larger, a larger number of the first connection lines 23 may be arranged in the wiring area 12 corresponding to the first non-display area 101. When the width of the wiring area 12 corresponding to the second non-display area 102 is larger, a larger number of the first connection lines 23 may be arranged in the wiring area 12 corresponding to the second non-display area 102. When the width of the wiring area 12 corresponding to the first non-display area 101 and the width of the wiring area 12 corresponding to the second non-display area 102 are the same, a same number of the first connection lines 23 may be arranged in the wiring area 12 corresponding to the first non-display area 101 and in the wiring area 12 corresponding to the second non-display area 102 respectively. The present disclosure does not specifically limit this, and the number of the first connection lines 23 that can be included in the wiring area 12 of each non-display area 10 may be adjusted according to the actual design of the display panel 100.

In one embodiment as shown in FIG. 1 to FIG. 23, specifically in FIG. 9, FIG. 15, or FIG. 18, the first connection lines 23 may be disposed only in the wiring area 12 corresponding to the second light-transmitting area 112.

When the display panel 100 includes the first non-display area 101 and the second non-display area 102 arranged adjacently, the width D1 of the wiring area 12 corresponding to the first light-transmitting area 111 included in the first non-display area 101 may be configured to be smaller than the width D2 of the wiring area 12 corresponding to the second light-transmitting area 112 in the second non-display area 102. Therefore, all the first connection lines 23 in the display panel 100 may be disposed in the wiring area 12 corresponding to the second light-transmitting area 112, and no first connection lines 23 may be disposed in the wiring area 12 corresponding to the first light-transmitting area 111.

The above embodiment where all the first connection lines 23 are disposed in the wiring area 12 corresponding to the second light-transmitting area 112 is only used as an example to illustrate the present disclosure, and does not limit the scope of the present disclosure. In various embodiments, the number of the first connection lines 23 that can be included in the wiring area 12 of each non-display area 10 may be adjusted according to the actual design of the display panel 100.

Figure 25:
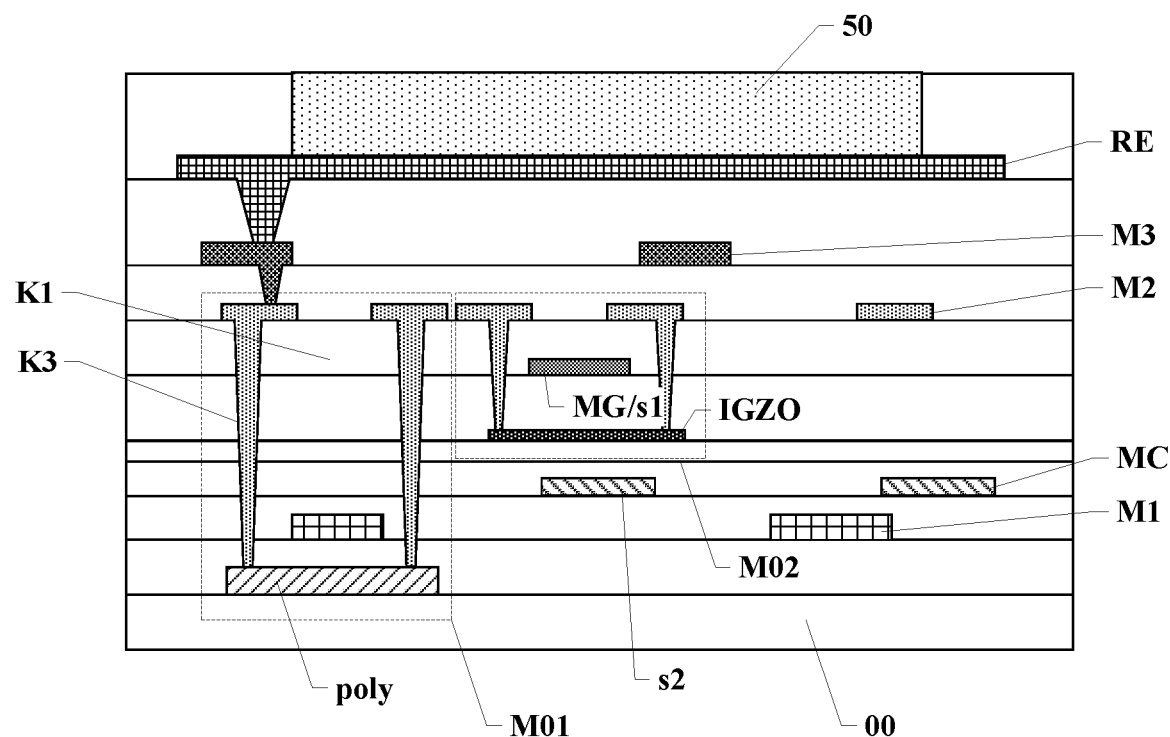
FIG. 25 illustrates a cross-sectional view of the display panel in FIG. 1 along a BB' direction, consistent with various disclosed embodiments of the present disclosure.

FIG. 25 shows a cross-sectional view along the BB' direction in FIG. 1. In one embodiment, as shown in FIG. 25 with reference to FIG. 1 to FIG. 24, the display panel 100 may at least include a first metal layer M1, a capacitor metal layer MC, and a gate metal layer MG. The capacitor metal layer MC may be located between the first metal layer M1 and the gate metal layer MG.

The first connection lines 23 may be disposed in the first metal layer M1, the capacitor metal layer MC and the gate metal layer MG respectively.

Since the display panel 100 includes many types of signal lines, to improve the resolution of the display panel 100 and ensure the normal arrangement of various types of signal lines, the display panel 100 usually include more than one metal layer for accommodating all signal lines. Therefore, in one embodiment of the present disclosure, the display panel 100 may at least include three metal layers stacked in layers: the first metal layer M1, the capacitor metal layer MC, and the gate metal layer MG. Each of these metal layers may be used to accommodate at least one type of signal lines.

In one embodiment, the display panel 100 may include first-type transistors and second-type transistors. Therefore, the first metal layer M1 may specifically be a film layer where gates of the first-type transistors M01 are located, and the gate metal layer MG may specifically be a film layer where the gates of the second-type transistors M02 are located.

Correspondingly, an arrangement of the first connection lines 23 in the wiring area 12 provided by the present embodiment may be that all the first connection lines 23 are respectively arranged in the three metal layers of the first metal layer M1, the capacitor metal layer MC and the gate metal layer MG. Only one type of driving signal line may be included in each metal layer, or one type of driving signal line may be divided to be disposed in two different metal layers or three metal layers. The types of driving signal lines included in the metal layers are not specifically limited, nor are the numbers of the types of driving signal lines included in each metal layer are also not limited. The number of the driving signal lines included in the metal layers are not specifically limited. For example, when the number of the first connection lines 23 is 3X, each of the first metal layer M1, the capacitor metal layer MC, and the gate metal layer MG may be configured to include X first connection lines 23, respectively. The number of the first connection lines 23 included in each metal layer may also be different, and the user may configure the number of the first connection lines 23 included in each metal layer according to actual needs.

Figure 26:
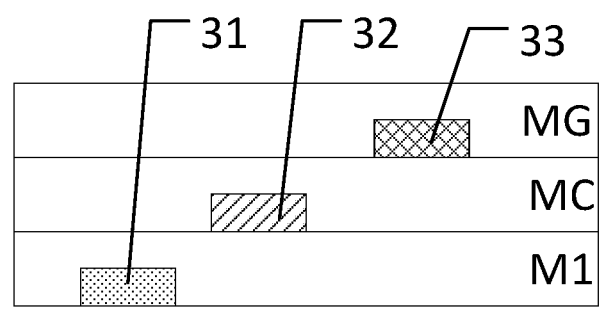
FIG. 26 illustrates a cross-sectional view of the display panel in FIG. 13 along a CC' direction, consistent with various disclosed embodiments of the present disclosure.
Figure 27:
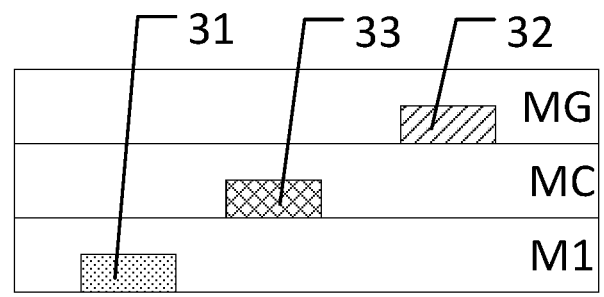
FIG. 27 illustrates another cross-sectional view of the display panel in FIG. 13 along the CC' direction, consistent with various disclosed embodiments of the present disclosure.

FIG. 26 shows a cross-sectional view along the CC' direction in FIG. 13, and FIG. 27 shows another cross-sectional view along the CC' direction in FIG. 13. In one embodiment shown in FIG. 26 and FIG. 27 with reference to FIG. 1 to FIG. 24, in one embodiment, one pixel circuit 70 may include a data writing module 61, a light-emitting control module 62, a reset module 63, and a compensation module 64. The circuit control signal lines 33 may include first circuit control lines 331 and second circuit control lines 332.

The scan lines 31 may be electrically connected to data writing modules 61, the light-emitting control signal lines may be electrically connected to light-emitting control modules 62, the first circuit control lines 331 may be electrically connected to reset modules 63, and the second circuit control lines 332 may be electrically connected to compensation modules 64.

In one embodiment as shown in FIG. 27, the first connection lines 23 of the circuit control signal lines 33 may be all located in the capacitor metal layer MC, and at least a portion of the first connection lines 23 of the scan lines 31 and the light-emitting control signal lines 32 may be located in the gate metal layer MG.

In another embodiment, as shown in FIG. 26, the first connection lines 23 of the circuit control signal lines 33 may be all located in the gate metal layer MG, and at least a portion of the first connection lines 23 of the scan lines 31 and the light-emitting control signal lines 32 may be located in the capacitive metal layer MC.

Each pixel circuit 70 included in the display panel 100 may include the data writing module 61, the light-emitting control module 62, the reset module 63 and the compensation module 64. The driving signal lines electrically connected to the data writing modules 61 may be the scan lines 31, the driving signal line electrically connected to the light-emitting control modules 62 may be the light-emitting control signal line 32, the driving signal line electrically connected with the reset modules 63 may be the first circuit control lines 331, and the driving signal lines electrically connected to the compensation modules 64 may be the second circuit control lines 332. That is, in one embodiment, the types of the driving signal lines may at least include three types of lines: the scan lines 31, the light-emitting control signal lines 32 and the circuit control signal lines 33. It should be added that the present disclosure is not limited to this, and the types of the driving signal lines may be adjusted according to the specific design of the display panel 100, which is not specifically limited in the present disclosure.

Correspondingly, the number of the scan lines 31 required to include the first connection lines 23 may be 2X, the number of the light-emitting control signal lines 32 required to include the first connection lines 23 may be X, and the number of the circuit control signal lines 33 required to include the first connection lines 23 may be X. As shown in FIG. 27, X first connection lines 23 of the circuit control signal lines 33 may be all located in the capacitor metal layer MC, 2X first connection lines 23 of the scan lines 31 may be located in the first metal layer M1, and X first connection lines 23 of the light-emitting control signal lines 32 may be all located in the gate metal layer MG. In another embodiment, X first connection lines 23 of the circuit control signal lines 33 may be all located in the capacitor metal layer MC, and 2X first connection lines 23 of the scan lines 31 may be all located in the gate metal layer MG, and X first connection lines 23 of the light-emitting control signal lines 32 may be located in the first metal layer M1. In another embodiment shown in FIG. 26, X first connection lines 23 of the circuit control signal lines 33 may be all located in the gate metal layer MG, 2X first connection lines 23 of the scan lines 31 may be located in the first metal layer M1, and X first connection lines 23 of the light-emitting control signal lines 32 may be all located in the capacitor metal layer MC. In another embodiment, the X first connection lines 23 of the circuit control signal lines 33 may be all located in the gate metal layer MG, the 2X first connection lines 23 of the scan lines 31 may be all located in the capacitor metal layer MC, and the X first connection lines 23 of the light-emitting control signal lines 32 may be all located in the first metal layer M1.

The above embodiments with the distribution manners of the first connection lines 23 in the three metal layers of the wiring areas 12 are used as examples to illustrate the present disclosure only, and do not limit the scope of the present disclosure. In various embodiments, the distribution manners of the first connection lines 23 in the metal layers may be adjusted according to the number of the first connection lines 23 and the types of the metal layers.

In existing technologies, regarding the scan lines 31, the light-emitting control signal lines 32, and the circuit control signal lines 33 included in the display panel 100, the scan lines 31 are usually arranged in the first metal layer M1, the light-emitting control signal lines 32 are also usually all arranged on the first metal layer M1, and the circuit control signal lines 33 are alternately arranged in the capacitance metal layer MC and the gate metal layer MG. Therefore, in the embodiments of the present disclosure, the driving signal lines located in the display area 01 may be configured according to the setting method in the existing technologies. For example, the first segments 21 and the second segments 22 included in the scan lines 31 may be all disposed in the first metal layer M1. The first segments 21 and the second segments 22 included in the light-emitting control signal lines 32 may be all disposed in the first metal layer M1. The first segments 21 and the second segments 22 included in the circuit control signal lines 33 may be alternately arranged in the capacitor metal layer MC and the gate metal layer MG.

Based on the above setting, to simplify the wiring in the display panel 100, in one embodiment, the first connection lines 23 included in the scan line 31 may be still disposed in the first metal layer M1. Therefore, it may be possible to avoid the need to set the scan lines 31 across layers in the wiring areas 12, such that all the scan lines 31 may be able to be fabricated in the same process, reducing the complexity of manufacturing the display panel 100. The first connection lines 23 included in the circuit control signal lines 33 may be all disposed in the capacitor metal layer MC or the gate metal layer MG. That is, the first connection lines 23 of the circuit control signal lines 33 may be disposed in any of the two metal layers involved in the existing technologies, to avoid the tediousness of cross-layer setting. The number of cross-layer punching required when setting the driving signal lines in the display panel 100 and the complexity of manufacturing the display panel 100 may be reduced. When the first connection lines 23 included in the circuit control signal lines 33 are all located in the capacitor metal layer MC, the gate metal layer MG may be used to accommodate the first connection lines 23 included in the light-emitting control signal lines 32. When the first connection line 23 included in the circuit control signal lines 33 are all located in the gate metal layer MG, the capacitor metal layer MC may be used to accommodate the first connection lines 23 included in the light-emitting control signal lines 32. Therefore, various types of the first connection lines 23 may be able to be arranged in the three metal layers of the wiring areas 12, and the number of lines requiring cross-layer electrical connection between the display area 01 and the non-display areas 10 may be reduced as much as possible. The integrity of the electrical signals received by the pixel circuits 70 in the display panel 100 may be ensured, and the problem that the area required for the wiring areas 12 is too large may be avoided, to increase the screen ratio of the display panel 100.

In one embodiment shown in FIG. 25 with reference to FIG. 1 to FIG. 24, all the first connection lines 23 may be evenly distributed in the first metal layer M1, the capacitor metal layer MC and the gate metal layer MG.

In the present embodiment, the number of the driving signal lines which are required to be disposed in the wiring areas 12 may be 3X, that is, the number of the first connection lines 23 may be 3X. Therefore, when the first metal layer M1, the capacitive metal layer MC and the gate metal layer MG included in the display panel 100 are able to be used to accommodate the first connection lines 23 with the preset values, each of the first metal layer M1, the capacitive metal layer MC and the gate metal layer MG may accommodate X first connection lines 23 respectively. That is, all the first connection lines 23 may be evenly distributed in the metal layers. Correspondingly, the width of the wiring area 12 required by each metal layer may be approximately same, to reduce the width of the wiring area 12 to a certain extent and increase the screen ratio of the display panel 100.

The number of the scan lines 31 required to include the first connection lines 23 may be 2X, the number of the light-emitting control signal lines 32 required to include the first connection lines 23 may be X, and the number of the circuit control signal lines 33 required to include the first connection lines 23 may be X. When disposing a same type of the signal lines in a same metal layer, one metal layer accommodating the scan lines 32 may include 2X first connection lines 23, and each of other two metal layers accommodating other two types of signal lines may include X first connection lines. Therefore, the width of the wiring areas 12 in the non-display areas 10 occupied by disposing the first connection lines 23 may be a width corresponding to 2X first connection lines 23. When all the first connection lines 23 are evenly distributed in the three metal layers, the width of the wiring areas 12 in the non-display areas 10 occupied by disposing the first connection lines 23 may be a width corresponding to X first connection lines 23.

Distributing all the first connection lines 23 evenly in the first metal layer M1, the capacitor metal layer MC and the gate metal layer MG may further reduce the width of the wiring areas 12 in the non-display areas 10, thereby further improving the screen ratio of the display panel 100. Of course, when all the first connection lines 23 are evenly distributed in the first metal layer M1, the capacitor metal layer MC and the gate metal layer MG, a larger number of driving signal lines may need to be connected between the display area 01 and the wiring areas 12 by punching holes, as long as it is ensured that the driving signal lines electrically connected by the punching holes across the layers are able to transmit electrical signals normally without affecting the display effect of the display panel 100. That is, the present disclosure does not specifically limit the film types of various types of driving signal lines crossing layers to other metal layers, nor does it specifically limit the number of driving signal lines that need to be punched and crossing layers. The actual design requirements of the display panel 100 can be adjusted accordingly.

When the display panel 100 including only the first metal layer M1, the capacitor metal layer MC, and the gate metal layer MG, is not enough to satisfy the cross-layer electrical connection of all the driving signal lines, other metal layers may be further added as the cross-layer electrical connection transition layer of the driving signal line.

In one embodiment shown in FIG. 25 with reference to FIG. 1 to FIG. 24, the display panel 100 may at least include a first metal layer M1, a capacitor metal layer MC, and a gate metal layer MG. The capacitor metal layer MC may be located between the first metal layer M1 and the gate metal layer MG.

One pixel circuit 70 may include a data writing module 61, a light-emitting control module 62, a reset module 63, and a compensation module 64. The circuit control signal lines 33 may include first circuit control lines 331 and second circuit control lines 332.

The scan lines 31 may be electrically connected to data writing modules 61, the light-emitting control signal lines may be electrically connected to light-emitting control modules 62, the first circuit control lines 331 may be electrically connected to reset modules 63, and the second circuit control lines 332 may be electrically connected to compensation modules 64.

the first connection lines 23 of the scan lines 31 may be all disposed in the first metal layer M1, the first connection lines 23 of the circuit control signal lines 33 and the first connection lines 23 of the light-emitting control signal lines 32 may be all located in the capacitor metal layer MC or in the gate metal layer MG.

When the space of the wiring areas 12 of the non-display areas 10 is enough, in one embodiment, the first connection lines 23 of the scan lines 31 may be all disposed in the first metal layer M1. The first connection lines 23 of the circuit control signal lines 33 and the first connection lines 23 of the light-emitting control signal lines 32 may be all located in the capacitor metal layer MC, or the first connection lines 23 of the circuit control signal lines 33 and the first connection lines 23 of the light-emitting control signal lines 32 may be all located in the gate metal layer MG. Correspondingly, the arrangement of all the first connection lines 23 may be realized by using only two metal layers, which may reduce the film thickness of the display panel 100 to a certain extent and make related display products lighter and thinner.

In the display panel 100, the number of the scan lines 31 required to include the first connection lines 23 may be 2X, the number of the light-emitting control signal lines 32 required to include the first connection lines 23 may be X, and the number of the circuit control signal lines 33 required to include the first connection lines 23 may be X. Therefore, the 2X first connection lines 23 of the scan lines 31 may be located in the first metal layer M1, the 2X first connection lines 23 of the circuit control signal lines 33 and the light-emitting control signal lines 32 may be all located in the capacitor metal layer MC, or 2X first connection lines 23 of the circuit control signal lines 33 and the light-emitting control signal lines 32 may be all located in the gate metal layer MG. Correspondingly, the two metal layers accommodating the first connection lines 23 may respectively include 2X first connection lines 23, and the widths of the required wiring areas 12 in the two metal layers may be the width corresponding to 2X first connection lines 23. That is, all the first connection lines 23 may be distributed evenly in the two metal layers. With this arrangement, the width of the wiring area 12 required by each metal layer may be approximately large, improving the aesthetics of the display panel 100 and further increasing the screen ratio of the display panel 100.

As shown in FIG. 25 with reference to FIG. 1 to FIG. 24, in one embodiment, the second segment 22 and the first segment 21 of at least one driving signal line may be disposed in a same layer.

The film layer arrangement of the first segment 21 and the second segment 22 in the display area 01 included in each driving signal line may follow the film layer arrangement of the related driving signal line in the existing technologies. For example, in existing technologies, the scan lines 31 are all arranged in the first metal layer M1, the light-emitting control signal lines 32 are also arranged in the first metal layer M1, and the circuit control signal lines 33 are arranged alternately in the capacitor metal layer MC and the gate metal layer MG. Therefore, in one embodiment of the present disclosure, the first segments 21 and the second segments 22 of the scan lines 31 may be disposed in the first metal layer M1. The first segments 21 and the second segments 22 of the light-emitting control signal lines 32 may be disposed in the first metal layer M1. The first segments 21 and the second segments 22 of the circuit control signal line 33 may be alternately arranged in the capacitor metal layer MC and the gate metal layer MG. With this arrangement, the first segments 21 and the second segments 22 included in each driving signal line in the display panel 100 may be fabricated simultaneously with other conventionally arranged driving signal lines in the same process, thereby avoiding the increase in the complexity of the process for the display panel 100.

The above embodiment where the first segment 21 and the second segment 22 of a same driving signal line are disposed in a same metal layer is used as an example to illustrate the present disclosure, and does not limit the scope of the present disclosure. In some other embodiments, the first connection line 23 and the second segment 22 of each driving signal line may be fabricated in a same metal layer. Or the first connection line 23 and the first segment 21 of each driving signal line may be fabricated in a same metal layer. Or, the first connection line 23, the first segment 21 and the second segment 22 of each driving signal line may be fabricated in a same metal layer. The present disclosure has no limit on this.

Figure 28:
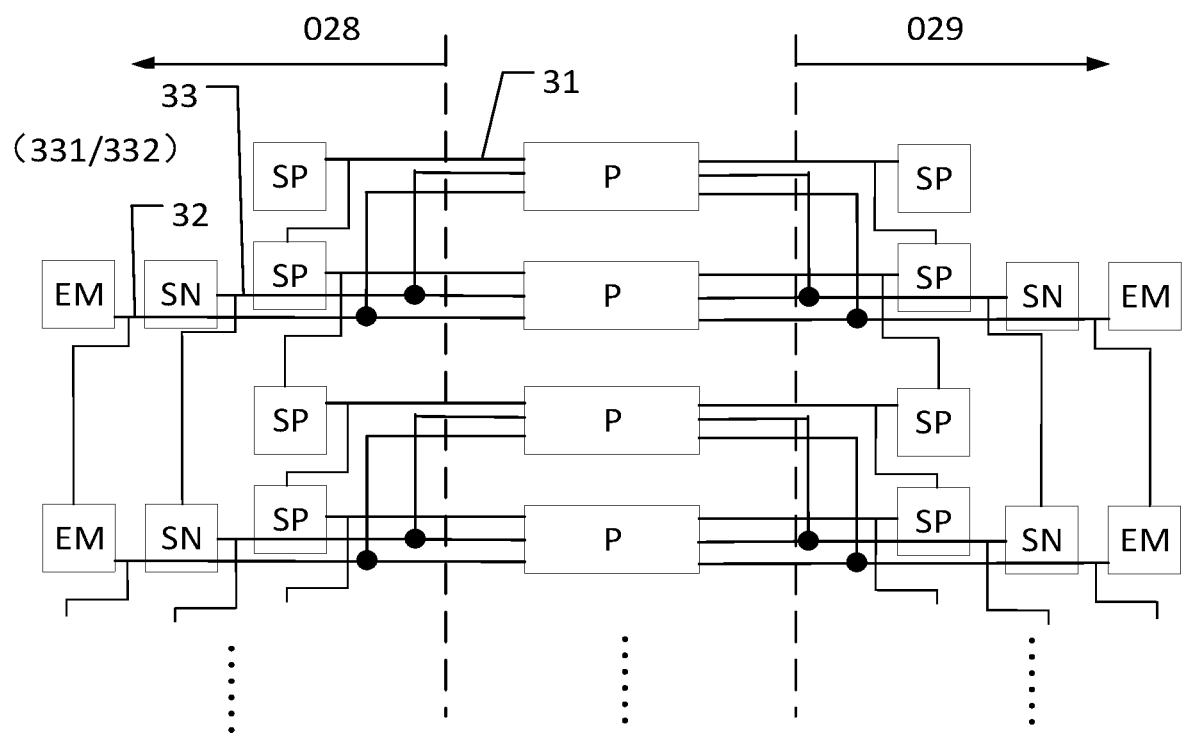
FIG. 28 illustrates a circuit diagram of an exemplary driving circuit consistent with various disclosed embodiments of the present disclosure.
Figure 29:
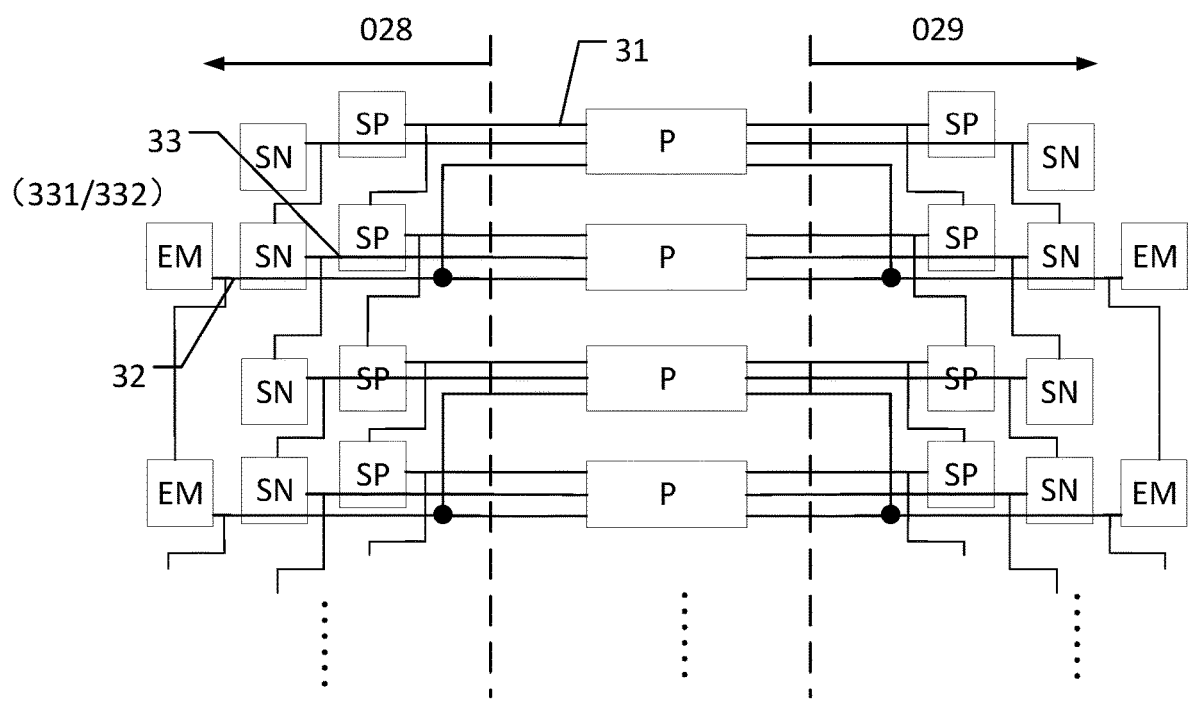
FIG. 29 illustrates another circuit diagram of an exemplary driving circuit consistent with various disclosed embodiments of the present disclosure.
Figure 30:
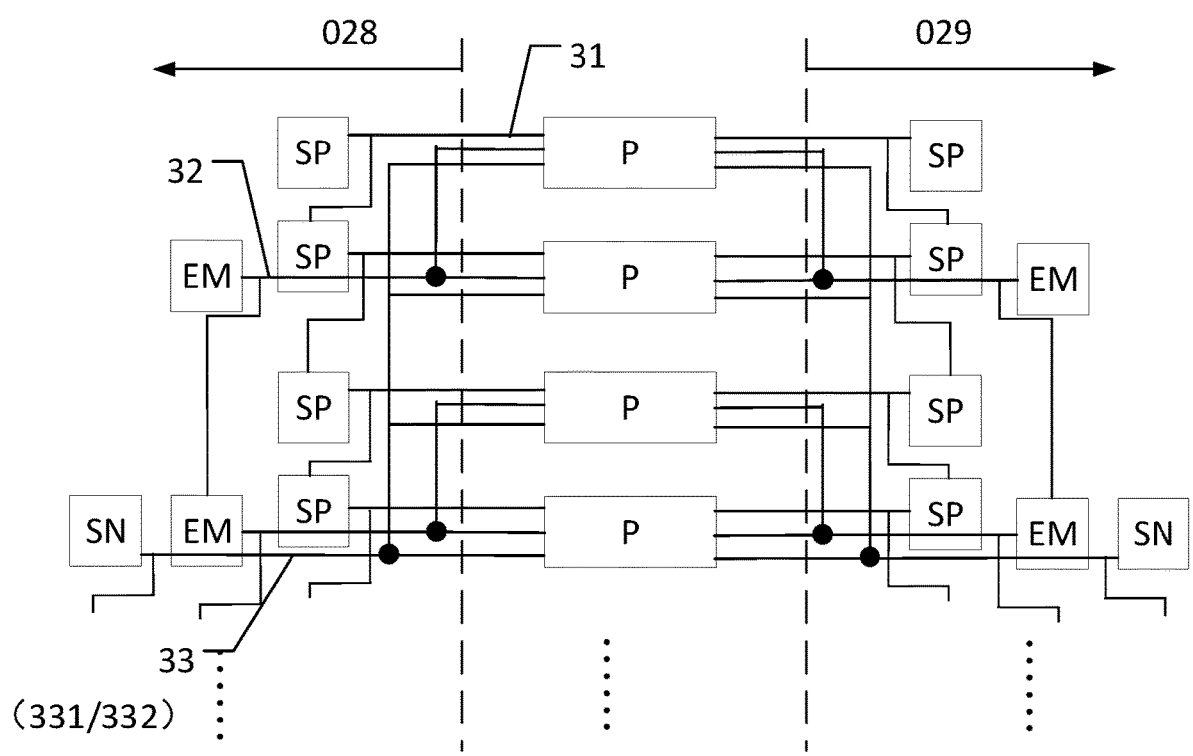
FIG. 30 illustrates another circuit diagram of an exemplary driving circuit consistent with various disclosed embodiments of the present disclosure.

FIG. 28 illustrates a circuit diagram of an exemplary driving circuit, FIG. 29 illustrates another circuit diagram of an exemplary driving circuit, and FIG. 30 illustrates another circuit diagram of an exemplary driving circuit. As shown in FIG. 28 to FIG. 30 with reference to FIG. 1 to FIG. 25, in one embodiment, the display panel 100 may at least include a first metal layer M1, a capacitor metal layer MC, and a gate metal layer MG. The capacitor metal layer MC may be located between the first metal layer M1 and the gate metal layer MG.

One pixel circuit 70 may include a data writing module 61, a light-emitting control module 62, a reset module 63, and a compensation module 64. The circuit control signal lines 33 may include first circuit control lines 331 and second circuit control lines 332.

The scan lines 31 may be electrically connected to data writing modules 61, the light-emitting control signal lines may be electrically connected to light-emitting control modules 62, the first circuit control lines 331 may be electrically connected to reset modules 63, and the second circuit control lines 332 may be electrically connected to compensation modules 64.

The display panel 100 may further include a frame area 02, and the frame area 02 may at least partially surround the display area 01. Along the first direction, the frame area 02 may include a first frame area 028 and a second frame area 029 at two side of the display area 01.

At least one of the first frame area 028 and the second frame area 029 may include a first gate driving circuit, a second gate driving circuit, a third gate driving circuit and a fourth gate driving circuit. The first gate driving circuit may include a plurality of first gate drive units EM connected in cascade, the second gate drive circuit may include a plurality of second gate drive units SN connected in cascade, the third gate drive circuit may include a plurality of second gate drive units SN connected in cascade, and the fourth gate driving circuit may include a plurality of fourth gate driving units SP connected in cascade.

The display area 01 may include a plurality of adjacently arranged first pixel row units, and each first pixel row unit may include M pixel rows P arranged adjacently. Two first pixel row units arranged adjacently may include different pixel rows.

The display area 01 may also include a plurality of second pixel row units arranged adjacently. Each second pixel row unit may include N pixel rows P arranged adjacently, and the two second pixel row units arranged adjacently may include different pixel rows.

Each first gate driving unit EM may be electrically connected to the light-emitting control signal modules in M rows of pixel circuits 70 arranged adjacently in a first pixel row unit through a light-emitting control signal line 32. Each second gate driving unit SN may be electrically connect the reset modules 63 in N rows of pixel circuits 70 arranged adjacently in one corresponding second pixel row unit through one first circuit control line 331. Each third gate driving unit SN may be electrically connected to the compensation modules 64 in the pixel circuits 70 of the adjacent N rows of pixel circuits 70 in one corresponding second pixel row unit through one corresponding second circuit control line 332. Each fourth gate driving unit SP may be electrically connected to the data writing modules 61 in the pixel circuits 70 in one row through one corresponding scan line 31. M>1, N>1, and both M and N are positive integers.

In the display panel 100, the scan lines 31 may all be set as one-drive-one. That is, in each scan line 31, one end may be electrically connected to one corresponding fourth gate driving unit SP, and another end may be electrically connected to one row of pixel circuits 70. The light-emitting control signal lines 32 may be set as one-drive-two. That is, in each light-emitting control signal line 32, one end may be electrically connected to one corresponding first gate driving unit EM, and another end may be electrically connected to two rows of pixel circuits 70. The first circuit control lines 331 and the second circuit control lines 332 may be set as one-drive-two or one-drive-four. That is, in each first circuit control line 331/second circuit control line 332, one end may be electrically connected to one corresponding second gate driving unit SN/third gate driving unit SN, and another end may be electrically connected to two or four rows of pixel circuits 70.

For example, when the first circuit control line 331 and the second circuit control line 332 are set as one-drive-four, the light-emitting control signal lines 32 are set as one-drive-two, and the scan lines 31 are set as one-drive-one, the first connection lines 23 may be set as the first connection line 23 of the 4X scan lines 31, the first connection line 23 of the 2X light-emitting control signal lines 32, and the first connection line 23 of the X circuit control signal lines 33. At this time, the first wiring area 121 at the upper side of the light-transmitting area 11 may be configured to accommodate the first connection lines 23 of 2X scan lines 31, and the second wiring area 122 at the lower side of the light-transmitting area 11 may be configured to accommodate the first connection lines 23 of the 2X scan lines 31. Further, the 4X scan lines 31 may be set as bilateral one-drive-one. That is, for example, when the first non-display area 101 and the second non-display area 102 are included, the specific detail structure of the 4X scan lines 31 may be that the first segments 21, the first connection lines 23, the second segments 22, the first connection lines 23, and the first segments 21 may be connected with each other. The first connection lines at two sides of one second segment 22 may be respectively located in the wiring area 12 of the first non-display area 101 and the wiring area 12 of the second non-display area 102. At this time, the first connection lines 23 of X light-emitting control signal lines 32 and the first connection lines 23 of (X/2) circuit control signal lines 33 may be arranged in the first wiring area 121 at the upper side of the light-transmitting area 11. The first connection lines 23 of X light-emitting control signal lines 32 and the first connection lines 23 of (X/2) circuit control signal lines 33 may be located in the first wiring area 121 at the lower side of the light-transmitting area 11. Further, the 2X light-emitting control signal lines 32 and the X circuit control signal lines 33 may be further set to be bilaterally driven. That is, for example, when the first non-display area 101 and the second non-display area 102 are included, these two wirings may have five-segment structures. The first non-display area 101 and the second non-display area 102 may both include the first connection lines 23 located at both sides of the second segments 22. When the first connection lines 23 of the 4X scan lines 31, the first connection lines 23 of the 2X light-emitting control signal lines 32, and the first connection lines 23 of the X circuit control signal lines 33 are disposed in the three metals included in the display panel 100, the first connection lines 23 of the scan lines 31 may be arranged in the first metal layer M1, and the first connection lines 23 of the light-emitting control signal lines 32 and the first connection lines 23 of the circuit control signal lines 33 may be arranged in the gate metal layer or in the capacitor metal layer in the same layer. The first connection lines 23 of the light-emitting control signal lines 32 and the circuit control signal lines 33 arranged in the same layer may be arranged regularly in the inner and outer circles, or also be arranged alternately. The present disclosure has no specific limitation on this. Of course, in some other embodiments, the first connection lines 23 of the light-emitting control signal lines 32 and the first connection lines 23 of the circuit control signal lines 33 may also be arranged in different layers. That is, the first connection lines 23 of the scan lines 31, the light-emitting control signal lines 32, and the circuit control signal lines 33 may be configured by using three-layer metal layer design. Along the thickness direction of the display panel 100, the first connection wires 241 of each layer may be set to have no overlapping area to avoid the problem of interference between electrical signals. When the insulation effect is good, at least some of the first connection wires 241 of each layer may have overlapping areas.

In another embodiment, when the first circuit control line 331 and the second circuit control line 332 are set as one-drive-four, the light-emitting control signal lines 32 are set as one-drive-two, and the scan lines 31 are set as one-drive-one, the first connection lines 23 may be set as the first connection line 23 of the 4X scan lines 31, the first connection line 23 of the 2X light-emitting control signal lines 32, and the first connection line 23 of the X circuit control signal lines 33. The display panel 100 may include the first non-display area 101 and the second non-display area 102. The scan lines 31, the light-emitting control signal lines 32, and the circuit control signal lines 33 corresponding to the non-display area 10 may be set to be driven unilaterally. For example, the drive signal lines at the left side of the first non-display area 101 (the first segments 21) may extend to the left side of the first non-display area 101 and then stop. The drive signal lines (the first segments 21) at the right side of the second non-display area 102 may be routed through the wiring area 12 of the second non-display area 102 through the first connection lines 23 to electrically connect to the second segments 22 between the two non-display areas 10. That is, all the first connection lines 23 of the driving signal lines including the first connection lines 23 may be located in the wiring area 12 of the second non-display area 102. At this time, the first connection lines 23 of the scan lines 31, the light-emitting control signal lines 32, and the circuit control signal lines 33 may be configured to be wired in the first wiring area 121 and the second wiring area 122 in the second non-display area 102. The scanning lines 31 may be set in the same metal layer. The light-emitting control signal lines 32 and the circuit control signal lines 33 may be set in other metal layers different from the metal layer where the scanning lines 31 are located. The light-emitting control signal lines 32 and the circuit control signal lines 33 may be wired with a double-layer metal layer or a single-layer metal layer. The light-emitting control signal lines 32 and the circuit control signal lines 33 may be arranged regularly in the inner and outer circles, or also be arranged alternately. The present disclosure has no specific limitation on this. Along the thickness direction of the display panel 100, the first connection wires 241 of each layer may be set to have no overlapping area to avoid the problem of interference between electrical signals. When the insulation effect is good, at least some of the first connection wires 241 of each layer may have overlapping areas.

When the scan lines 31, the light-emitting control signal lines 32, and the circuit control signal lines 33 corresponding to the non-display areas 10 are set for unilateral driving, the first connection lines 23 included in the scan lines 31, the light-emitting control signal lines 32, and the circuit control signal lines 33 may also be disposed in the wiring area 12 of the first non-display area 101. The first segments 21 at the side of the second non-display area 102 away from the first non-display area 101 may only end up to the side of second non-display area 102 away from the first non-display area 101. At the right side of the second non-display area 102, there may be the electrical connection between three types of segments including the second segments 22, the first connection lines 23 located in the first non-display area 101, and the first segments 21 at the side of the first non-display area 101 away from the second of the second non-display area 102. The film layer structure and the wiring arrangement of the first connection lines 23 may be configured according to requirements.

In another embodiment, in the scan lines 31, the light-emitting control signal lines 32, and the circuit control signal lines 33 corresponding to the non-display areas 10, the scan lines 31 and the circuit control signal lines 33 may be set for unilateral driving. The light-emitting control signal lines 32 may be set for bilateral driving. When the scan lines 31 and the circuit control signal lines 33 may be set for unilateral driving, the first connection lines 23 included in the scan lines 31 and the circuit control signal lines 33 may be disposed all in the first non-display area 101 or all in the second non-display area 102. Or the first connection lines 23 included in one of the scan lines 31 and the circuit control signal lines 33 may be disposed in the first non-display area 101, and the first connection lines 23 included in another one of the scan lines 31 and the circuit control signal lines 33 may be disposed in the second non-display area 102.

In one embodiment, for the scan lines 31 including the first connection lines 23 as an example, a portion of the scan lines 31 including the first connection lines 23 may be set to be unilaterally driven, and another portion of the scan lines 31 including the first connection lines 23 may be set to be bilaterally driven. The first connection lines 23 of the portion of the scan lines 31 of the unilateral drive may be located all in the first non-display area 101 or all in the second non-display area 102. Or the first connection lines 23 of the portion of the scan lines 31 of the unilateral drive may be located partially in the first non-display area 101 and partially in the second non-display area 102. The number of the first connection lines 23 in the first wiring area 121 and the second wiring area 122 on both sides of the light-transmitting area 11 may also be adjusted according to the requirements. The present disclosure has no limit on this. The distribution of the first connection lines 23 of the scan lines 31 driven by unilateral drive or bilateral drive in the first wiring area 121 and the second wiring area 122 on both sides of the light-transmitting area may also be adjusted according to requirements, which is not specifically limited in the present disclosure. Furthermore, whether the scan lines 31 are all located in the same metal layer also is not limited in the present disclosure, and the user may make corresponding adjustments according to actual design requirements. The arrangement of the lighting control signal lines 32 and the circuit control signal lines 33 are similar, and will not be repeated here.

For example, in the scan lines 31, the light-emitting control signal lines 32, and the circuit control signal lines 33 disposed correspondingly in the non-display areas 10, when the space in the wiring areas 12 of the non-display areas 10 is not enough to set the required number of first connection lines 23, a portion of the driving signal lines disposed correspondingly in the non-display areas 10 may be configured to include the second connection lines 24. For example, when a portion of the scan lines 31 is set to include the second connection lines 24 and the portion of the scan lines 31 are unilaterally driven, the second connection lines 24 may be disposed in the wiring areas 12 at a side of the first non-display area 101 or second non-display area 102 away from the light-transmitting area 11. When the portion of the scan lines 31 are bilaterally driven, the second connection lines 24 may be disposed in the wiring areas 12 at a side of the first non-display area 101 or second non-display area 102 away from the light-transmitting area 11, or the second connection lines 24 may be disposed in the wiring area 12 at a side of the first non-display area 101 away from the light-transmitting area 11 and the wiring area 12 at a side of the second non-display area 102 away from the light-transmitting area 11. The second connection wires 242 included in the second connection lines 24 may be arranged in the display area 01, or may be arranged in the frame area 02, or may be partially arranged in the display area 01 and partially arranged in the frame area 02. There is no specific restriction by the present disclosure, and users may make relevant adjustments according to their needs. Similarly, part of the light-emitting control signal lines 32 and/or part of the circuit control signal lines 33 may also be routed through the second connection line 24, which will not be repeated here.

When two or more non-display areas 10 arranged adjacent to each other along the first direction are included, the normal electrical signal transmission of the pixel circuits 70 between the adjacent non-display areas 10 may be realized, and the driving signal lines may need to adopt the first connection lines 23 for wiring in the wiring areas 12 of the non-display areas 10, and/or adopt the second connection lines 24 for wiring in the display area 01 and/or the frame area 02. The driving signal lines that needs to be wired may be at least partially unilaterally driven, or may be at least partially bilaterally driven. One same type of lines may be partially unilaterally driven, or may be partially bilaterally driven. When unilateral drive is used, the first connection lines 23 included in the driving signal lines may be disposed in the first non-display area 101 or in the second non-display area 102. The first connection lines 23 in the three metal layers included in the display panel 100 may be distributed in different metal layers according to signal types, or may be arbitrarily arranged in two or three of the metal layers according to requirements. This is not specifically limited in the present disclosure, as long as it may ensure that the pixel circuits 70 between adjacent non-display areas 10 are normally driven, and the width of the wiring areas 12 is reduced as much as possible to increase the screen ratio of the display panel 100.

In another embodiment, a setup of the non-display areas 10 may be that two light-transmitting areas 11 are arranged adjacent to each other along the first direction, and there may also a non-display area 10 between the two light-transmitting areas 11. In the non-display area 10 between the two light-transmitting areas 11, some floating sub-pixels may also be formed at the same time, or no sub-pixels may be formed. The user may choose according to actual needs and related processes.

It should also be added that the embodiments provided in the present disclosure are directed to various arrangement modes where the driving lines extend along the first direction and need to pass through at least two non-display areas 10. Similarly, the arrangement of the driving lines that extend along the second direction and needs to pass through at least two non-display areas 10 may refer to the principles of the above-mentioned embodiments.

Figure 31:
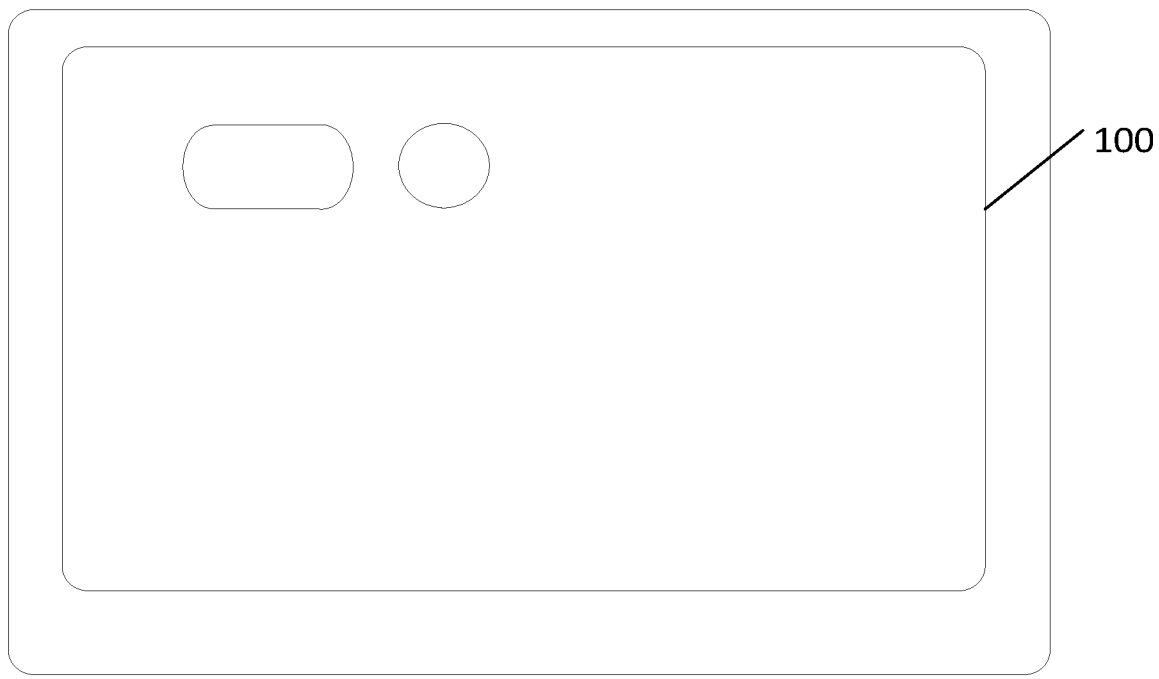
FIG. 31 illustrates an exemplary display device consistent with various disclosed embodiments of the present disclosure.

The present disclosure also provides a display device. As shown in FIG. 31 with reference to FIG. 1 to FIG. 30, in one embodiment, the display device 200 may include any display panel 100 provided by various embodiments of the present disclosure.

In the present disclosure, the display device 200 may be any display device with display function, such as a cell phone, a tablet, a television, a monitor, a laptop computer, or a navigator. The display device provided by the present disclosure may have advantages same as the display panels provided by the present disclosure.

In the display panel and display device provided by various embodiments of the present disclosure, by arranging the first connection lines in the wiring areas of the non-display areas, the second segments arranged between the two adjacent non-display areas and the first segments at least at one side of the at least two adjacent non-display area may be electrically connected through the first connection lines. Therefore, the reception of the electrical signals of the pixel circuits located between the two adjacent non-display areas may be realized, to ensure the normal display of the display area between the two adjacent non-display areas. Compared with a display device that cannot display a picture between two adjacent non-display areas, the screen ratio of the display device may be increased and the user experience may be improved.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments, but may be embodied in other equivalent forms without departing from the scope of the present disclosure, which is determined by the appended claims.

What is claimed is:

1. A display panel, comprising: a display area and at least two non-display areas arranged adjacently along a first direction, wherein:
   the display area at least partially surrounds the non-display areas;
   each of the at least two non-display areas includes at least one light-transmitting area and a wiring area, wherein the wiring area at least partially surrounds the at least one light-transmitting area;
   the display area includes a plurality of pixel circuits and a plurality of driving signal lines electrically connected with the plurality of pixel circuits; and
   a driving signal line of the plurality of driving signal lines includes a first segment in the display area, a first connection line located in the wiring area, and a second segment located between the at least two non-display areas that are arranged adjacently, wherein the first segment is connected to the second segment through the first connection line and the first segment is at least located at a side of the at least two non-display areas that are arranged adjacently.

2. The display panel according to claim 1, wherein:
   the first segment includes a first sub-first-segment located at a first side of the at least two non-display areas that are arranged adjacently and a second sub-first-segment located at a second side of the at least two adjacent non-display area; and
   the first sub-first-segment is connected to the second sub-first-segment through a corresponding first connection line.

3. The display pane according to claim 2, wherein:
   the at least two non-display areas that are arranged adjacently include a first non-display area and a second non-display area;
   along the first direction, a width of the first non-display area is larger than a width of the second non-display area; and
   the first connection lines are located in the second non-display area.

4. The display pane according to claim 2, wherein:
   the at least two non-display areas that are arranged adjacently include a first non-display area and a second non-display area;
   along the first direction, a width of the first non-display area is larger than a width of the second non-display area; and
   the first connection lines are located in the first non-display area.

5. The display panel according to claim 1, wherein:
the first segment includes a first sub-first-segment located at a first side of the at least two non-display areas that are arranged adjacently and a second sub-first-segment located at a second side of the at least two non-display areas that are arranged adjacently; and
the first sub-first-segment is connected to a first end of a corresponding second segment through a corresponding first connection line, and the second sub-first-segment is connected to a second end of the corresponding second segment through a corresponding first connection line.

6. The display pane according to claim 1, wherein:
along a second direction, the wiring area includes a first wiring area and a second wiring area located at two sides of the at least one light-transmitting area respectively, wherein the second direction intersects the first direction; and
the driving signal lines are disposed in both the first wiring area and the second wiring area.

7. The display pane according to claim 6, wherein:
along the second direction, the first connection lines are distributed at two sides of the at least one light-transmitting area evenly in number.

8. The display panel according to claim 6, wherein:
each of the plurality of pixel circuits includes a data writing module, and the driving signal lines include scan lines electrically connected to data writing modules; and
the first connection lines of the scan lines are disposed both in the first wiring area and the second wiring area.

9. The display panel according to claim 8, wherein:
the pixel circuit further includes a light-emitting control module, a reset module and a compensation module;
the driving signal lines further include light-emitting control signal lines and circuit control signal lines;
the circuit control signal lines include first circuit control lines and second circuit control lines;
a light-emitting control signal line is electrically connected with a corresponding light-emitting control module;
a first circuit control line is electrically connected with a corresponding reset module;
a second circuit control line is electrically connected with a corresponding compensation module;
the first connection lines of the light-emitting control signal lines are all located in the first wiring area, and the first connection lines of the circuit control signal lines are all located in the second wiring area.

10. The display panel according to claim 8, wherein:
the pixel circuit further includes a light-emitting control module, a reset module and a compensation module;
the driving signal lines further include light-emitting control signal lines and circuit control signal lines;
the circuit control signal lines include first circuit control lines and second circuit control lines;
a light-emitting control signal line is electrically connected with a corresponding light-emitting control module;
a first circuit control line is electrically connected with a corresponding reset module;
a second circuit control line is electrically connected with a corresponding compensation module;
the first connection lines of the first circuit control lines and at least a portion of the first connection lines of the light-emitting control signal lines are disposed in the first wiring area, and the first connection lines of the second circuit control lines at least a remaining portion of the first connection lines of the light-emitting control signal lines are located in the second wiring area.

11. The display panel according to claim 10, wherein:
the at least two non-display areas that are arranged adjacently include a first non-display area and a second non-display area;
along the first direction, a width of the first non-display area is larger than a width of the second non-display area width; and
the first connection lines included in the scan lines are all located in the second non-display area.

12. The display panel according to claim 10, wherein:
the at least two non-display areas that are arranged adjacently include a first non-display area and a second non-display area;
along the first direction, a width of the first non-display area is larger than a width of the second non-display area width;
at least a portion of the first connection lines included in the light-emitting control signal lines is located in the second non-display area; and
at least a portion of the first connection lines included in the circuit control signal lines is located in the second non-display area.

13. The display panel according to claim 1, wherein:
one of the plurality of driving signal lines further includes a second connection line;
the first segment is connected to the second segment through the second connection line;
the second connection line includes two first connection wires and one second connection wire;
the first connection wires extend along the second direction, and the second connection wire extends along the first direction, wherein the second direction intersects the first direction;
along the second direction, the second connection wire is located at a side of the wiring area away from the at least one light-transmitting area, and two ends of the second connection wire are respectively electrically connected to the two first connection wires;
along the first direction, another end of one of the first connection wires is electrically connected to the second segment, and another end of another one of the first connection line is electrically connected to the first segment.

14. The display panel according to claim 13, wherein:
each of the plurality of pixel circuits includes a data writing module, and the driving signal lines include scan lines electrically connected to data writing modules; and
the driving signal lines including the second connection lines are the scan lines.

15. The display panel according to claim 13, wherein:
the second connection wires are at least partially located in the display area.

16. The display panel according to claim 13, further comprising a frame area, wherein:
the frame area at least partially surrounds the display area, and the second connection wires are at least partially located in the frame area.

17. The display panel according to claim 13, wherein:
each of the plurality of pixel circuits includes a data writing module, a light-emitting control module, a reset module and a compensation module;
the driving signal lines further include scan lines electrically connected to data writing module, light-emitting control signal lines electrically connected with light-emitting control modules, and first circuit control line electrically connected with reset modules;

along the second direction, the light-emitting control signal lines electrically connected with a same one of the plurality of pixel circuits are located between one corresponding scan line and one corresponding first circuit control line, wherein the second direction intersects the first direction; and along the second direction, one second connection wire is located between one corresponding light-emitting control signal line and one corresponding first circuit control line.

18. The display panel according to claim 13, wherein:
each of the plurality of pixel circuits includes a data writing module, a light-emitting control module, a reset module and a compensation module;
the driving signal lines further include scan lines electrically connected to data writing module, light-emitting control signal lines electrically connected with light-emitting control modules, and first circuit control line electrically connected with reset modules;
along the second direction, the light-emitting control signal lines electrically connected with a same one of the plurality of pixel circuits are located between one corresponding scan line and one corresponding first circuit control line, wherein the second direction intersects the first direction; and
along the second direction, one second connection wire is located between first circuit control lines in a previous row of the plurality of pixel circuits and scan lines in a next row of the plurality of pixel circuits arranged adjacently.

19. The display panel according to claim 1, wherein:
along the first direction, the at least one light-transmitting area includes at least one first light-transmitting area and at least one second light-transmitting area; and
along the first direction, a width of the at least one first light-transmitting area is W1, and a width of the at least one second light-transmitting area is W2, wherein W1>W2.

20. The display device according to claim 19, wherein:
a width of a wiring area surrounding the at least one first light-transmitting area is D1, and a width of another wiring area surrounding the at least one second light-transmitting area is D2, wherein D1<D2.

21. The display panel according to claim 20, wherein:
the first connection lines are only disposed in one wiring area corresponding to the at least one second light-transmitting area.

22. The display panel according to claim 19, wherein:
an orthographic projection of the at least one first light-transmitting area on a plane where the display panel is located is a racetrack shape, and an orthographic projection of the at least one second light-transmitting area on the plane where the display panel is located is a circle.

23. The display panel according to claim 1, wherein:
the display panel at least includes a first metal layer, a capacitor metal layer, and a gate metal layer;
the capacitor metal layer is located between the first metal layer and the gate metal layer; and
all the first connection lines are arranged separately in the first metal layer, the capacitor metal layer and the gate metal layer.

24. The display panel according to claim 23, wherein:
each of the plurality of pixel circuits includes a data writing module, a light-emitting control module, a reset module and a compensation module;
the driving signal lines include scan lines, light-emitting control signal lines, and circuit control signal lines;
the circuit control signal lines include first circuit control lines and second circuit control lines;
the scan lines are electrically connected to data writing modules;
the light-emitting control signal lines are electrically connected with light-emitting control modules;
the first circuit control lines are electrically connected with reset modules;
the second circuit control lines are electrically connected with compensation modules; and
the first connection lines of the circuit control signal lines are all located in the capacitive metal layer, and at least a portion of the first connection lines of the scan lines and the light-emitting control signal lines are located in the gate metal layer; or, the first connection lines of the circuit control signal lines are all located in the gate metal layer, and at least a portion of the first connection lines of the scan lines and the light-emitting control signal lines are located in the capacitance metal layer.

25. The display panel according to claim 23, wherein:
all the first connection lines are distributed in the first metal layer, the capacitor metal layer and the gate metal layer evenly in number.

26. The display panel according to claim 1, wherein:
the display panel at least includes a first metal layer, a capacitor metal layer, and a gate metal layer;
the capacitor metal layer is located between the first metal layer and the gate metal layer;
each of the plurality of pixel circuits includes a data writing module, a light-emitting control module, a reset module and a compensation module;
the driving signal lines includes scan lines, light-emitting control signal lines, and circuit control signal lines;
the circuit control signal lines include first circuit control lines and second circuit control lines;
the scan lines are electrically connected to data writing modules;
the light-emitting control signal lines are electrically connected with light-emitting control modules;
the first circuit control lines are electrically connected with reset modules;
the second circuit control lines are electrically connected with compensation modules; and
the first connection lines included in the scan lines are all located in the first metal layer; the first connection lines included in the circuit control signal lines and the first connection lines included in the light-emitting control signal lines are all located in the capacitor metal layer, or, all located in the gate metal layer.

27. The display panel according to claim 1, wherein:
The second segment and the first segment included in at least one of the plurality of driving signal lines are located in one same metal layer.

28. The display panel according to claim 1, wherein:
the display panel at least includes a first metal layer, a capacitor metal layer, and a gate metal layer;
the capacitor metal layer is located between the first metal layer and the gate metal layer;
each of the plurality of pixel circuits includes a data writing module, a light-emitting control module, a reset module and a compensation module;

the driving signal lines include scan lines, light-emitting control signal lines, and circuit control signal lines;
the circuit control signal lines include first circuit control lines and second circuit control lines;
the scan lines are electrically connected to data writing modules;
the light-emitting control signal lines are electrically connected with light-emitting control modules;
the first circuit control lines are electrically connected with reset modules;
the second circuit control lines are electrically connected with compensation modules;
the display panel further includes a frame area;
the frame area at least partially surrounds the display area;
along the first direction, the frame area includes a first frame area and a second frame area at two sides of the display area;
at least one of the first frame area and the second frame area includes a first gate driving circuit, a second gate driving circuit, a third gate driving circuit and a fourth gate driving circuit;
the first gate driving circuit includes a plurality of cascade-connected first gate driving units, the second gate driving circuit includes a plurality of cascade-connected second gate driving units, and the third gate driving circuit includes a plurality of cascade-connected third gate driving units, and the fourth gate drive circuit includes a plurality of cascade-connected fourth gate drive units;
the display area includes a plurality of adjacent first pixel row units;
each of the plurality of first pixel row units includes M adjacently arranged pixel rows, and two adjacently arranged first pixel row units include different pixel rows;
the display area also includes a plurality of adjacently arranged second pixel rows unit;
each of the plurality of second pixel row units includes N adjacently arranged pixel rows, and two adjacently arranged second pixel row units include different pixel rows;
each of the plurality of first gate driving units is electrically connected to the light-emitting control signal modules in the pixel circuits in M rows of adjacent first pixel row units through one of the light-emitting control signal lines;
each of the plurality of second gate driving units is electrically connected to the reset modules in the pixel circuits in N rows of adjacent second pixel row units through one of the first circuit control lines;
each of the plurality of third gate driving units is electrically connected to the compensation modules in the pixel circuits in N rows of adjacent first pixel row units through one of the second circuit control lines; and
each of the plurality of fourth gate driving units is electrically connected to the data writing modules in the pixel circuits in one row of adjacent first pixel row units through one of the scan lines, wherein M≥1, N≥1, and M and N are both positive integers.

29. A display device, comprising a display panel, wherein the display panel includes:
a display area and at least two non-display areas arranged adjacently along a first direction, wherein:
the display area at least partially surrounds the non-display areas;
each of the at least two non-display areas includes at least one light-transmitting area and a wiring area, wherein the wiring area at least partially surrounds the at least one light-transmitting area;
the display area includes a plurality of pixel circuits and a plurality of driving signal lines electrically connected with the plurality of pixel circuits; and
a driving signal line of the plurality of driving signal lines includes a first segment in the display area, a first connection line located in the wiring area, and a second segment located between the at least two non-display areas that are arranged adjacently, wherein the first segment is connected to the second segment through the first connection line and the first segment is at least located at a side of the at least two non-display areas that are arranged adjacently.

* * * * *